United States Patent [19]

Cooke et al.

[11] Patent Number: 5,112,119
[45] Date of Patent: May 12, 1992

[54] SUPPORT STRUCTURE FOR DEVICES IN A COMPUTER APPARATUS

[75] Inventors: Kevin K. Cooke, Delray Beach; John R. Dewitt, Boca Raton, both of Fla.

[73] Assignee: International Business Machines Corp., Armonk, N.Y.

[21] Appl. No.: 428,099

[22] Filed: Oct. 27, 1989

[51] Int. Cl.⁵ .............................................. H05K 5/00
[52] U.S. Cl. .................................... 312/283; 361/394
[58] Field of Search ............... 312/341.1, 35 C, 283, 312/289; 361/390, 391, 393, 394; 211/26, 41

[56] References Cited

U.S. PATENT DOCUMENTS

| | | | |
|---|---|---|---|
| 3,218,518 | 11/1965 | Ashbridge et al. | 361/394 |
| 3,824,472 | 7/1974 | Engel et al. | 361/391 X |
| 3,868,158 | 2/1975 | Laboue | 312/350 |
| 4,497,411 | 2/1985 | DeBortoli | 211/26 |
| 4,600,107 | 7/1986 | Price et al. | 211/41 |

OTHER PUBLICATIONS

IBM Technical Disclosure Bulletin vol. 21 No. 4 Sep. 1978.

Primary Examiner—Joseph Falk
Attorney, Agent, or Firm—Mark P. Kahler

[57] ABSTRACT

A personal computer enclosure is provided which is reinforced by a disk drive support structure inside the box. The enclosure is a substantially parallelepiped outer box having an opening for providing access to the interior of the box. The box includes a plurality of mounting locations on the interior of the box. The inner support structure includes a plurality of bays for receiving respective disk drives therein. These bays communicate with the opening in the enclosure. The structure is attached to said outer box at said mounting locations to provide structural integrity thereto.

18 Claims, 31 Drawing Sheets

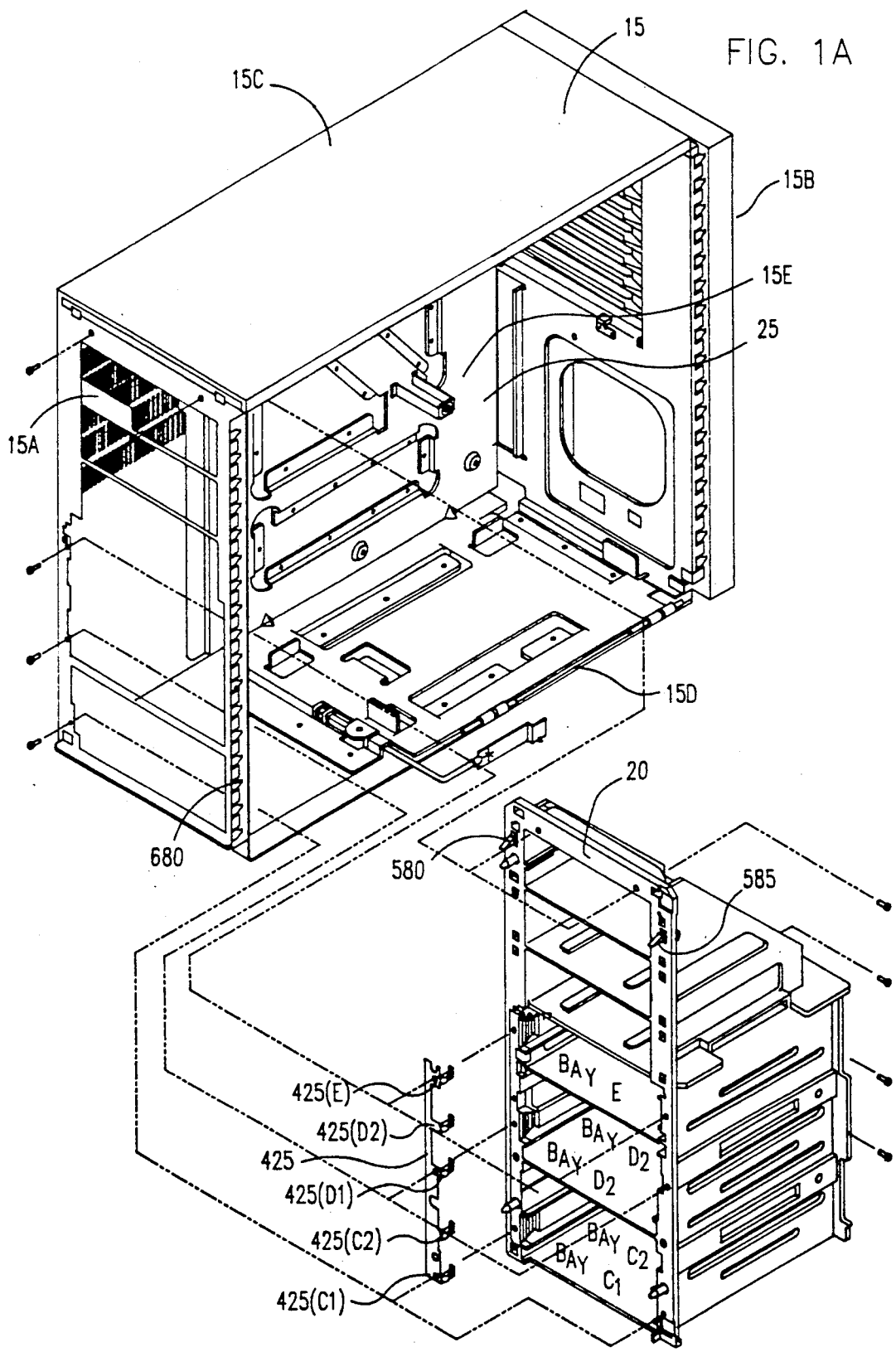

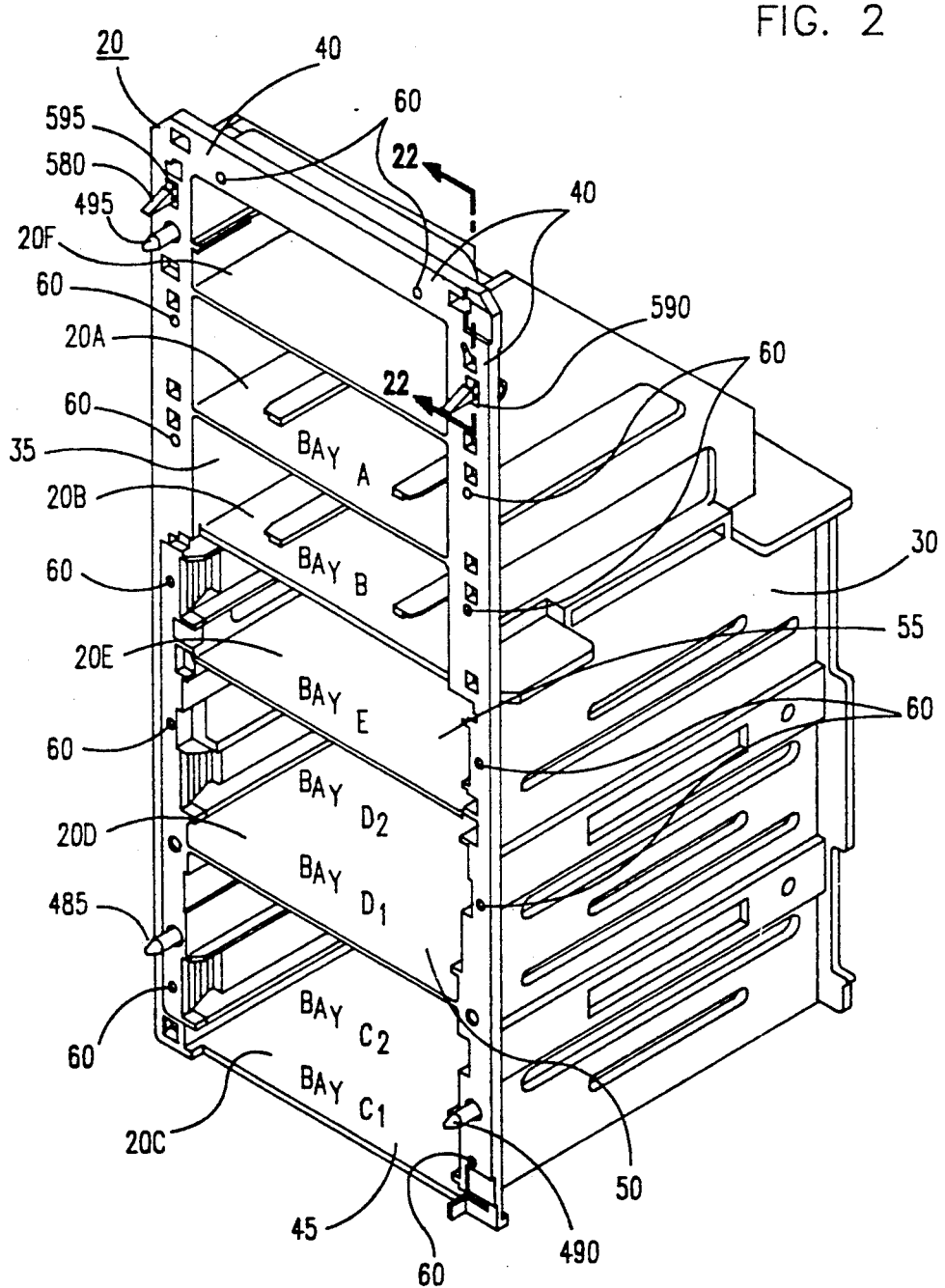

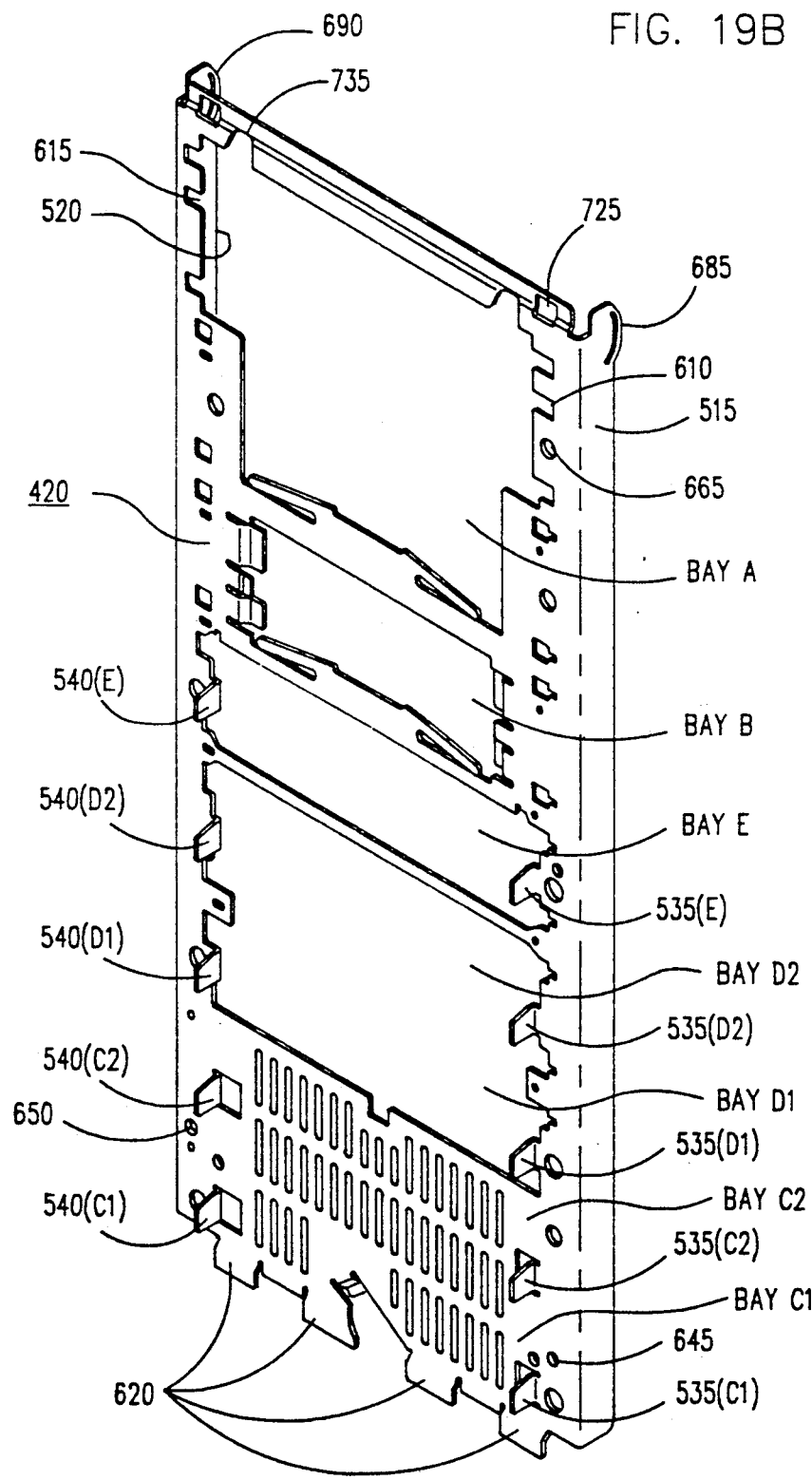

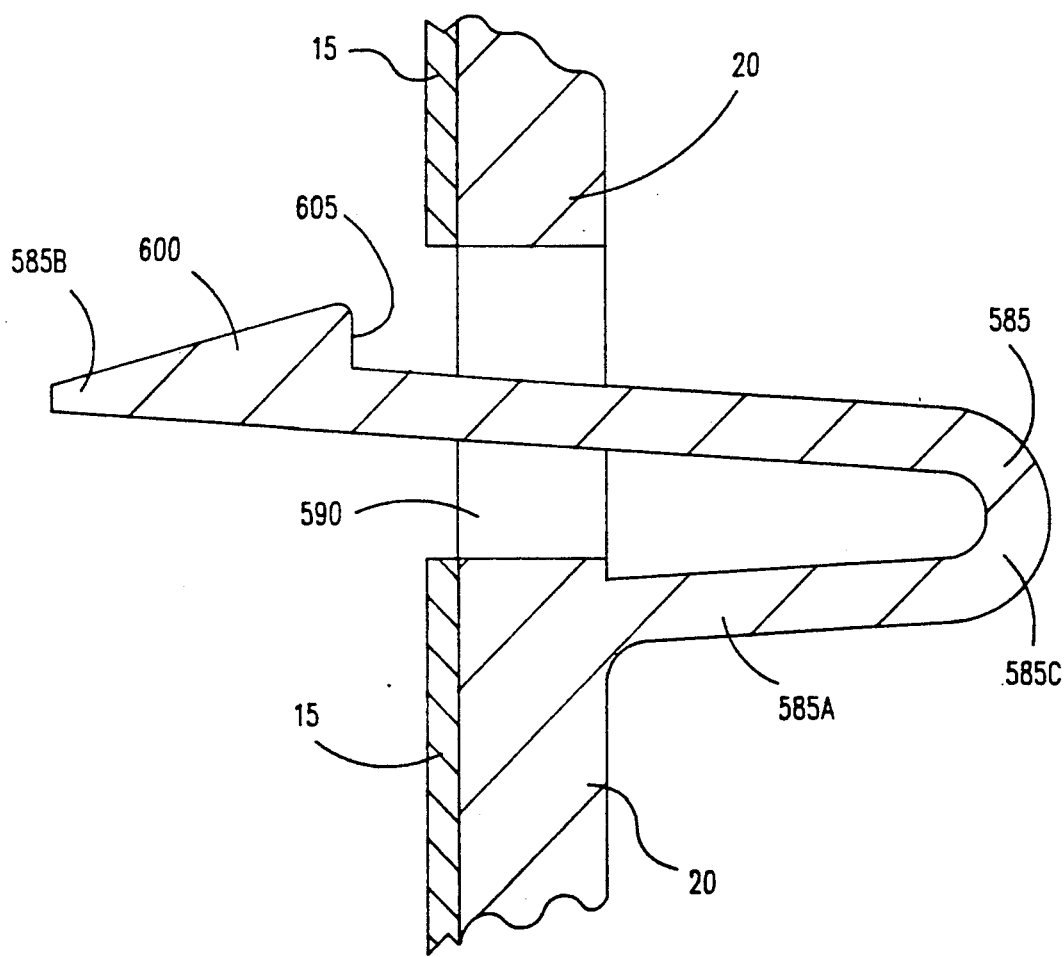

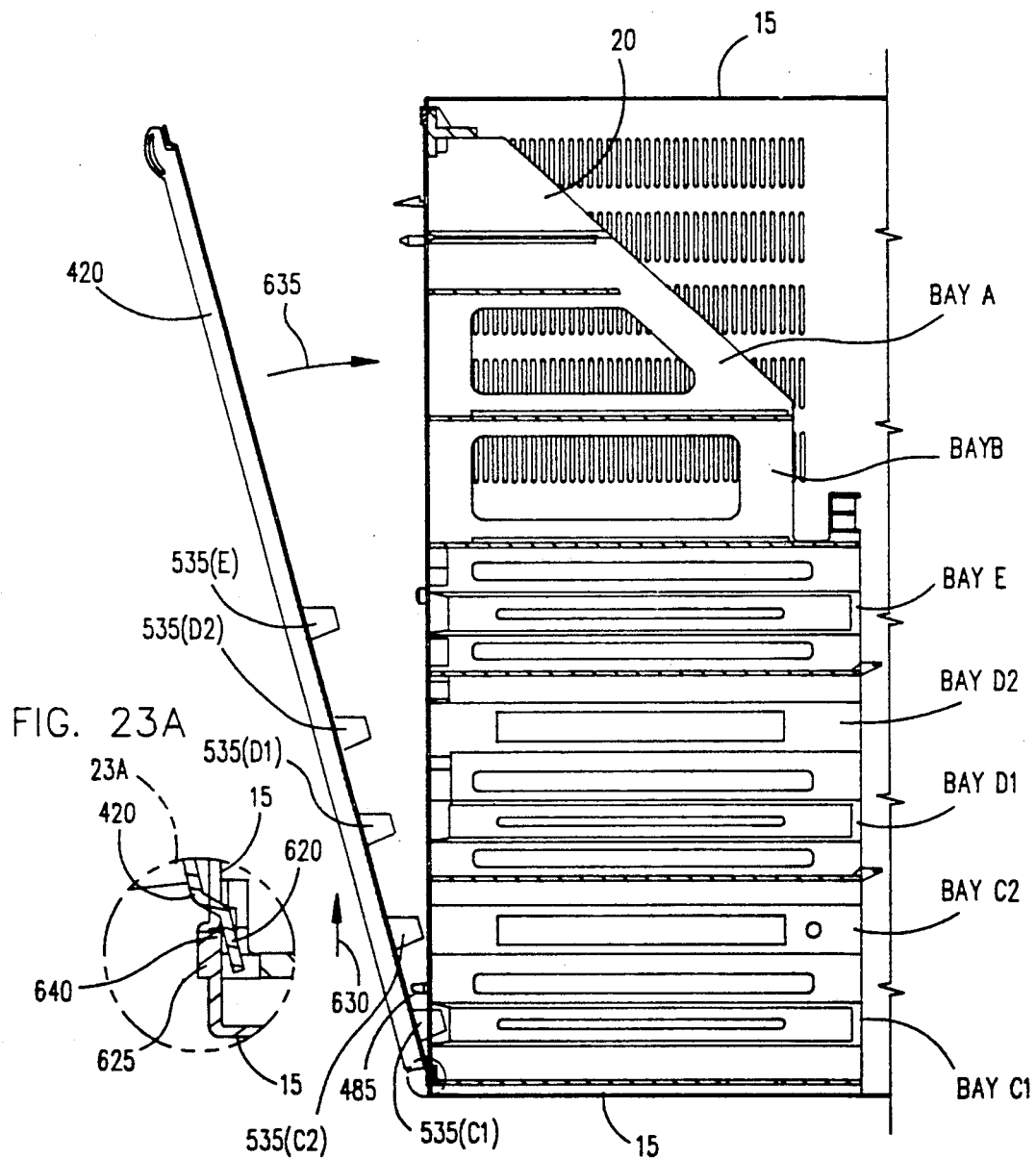

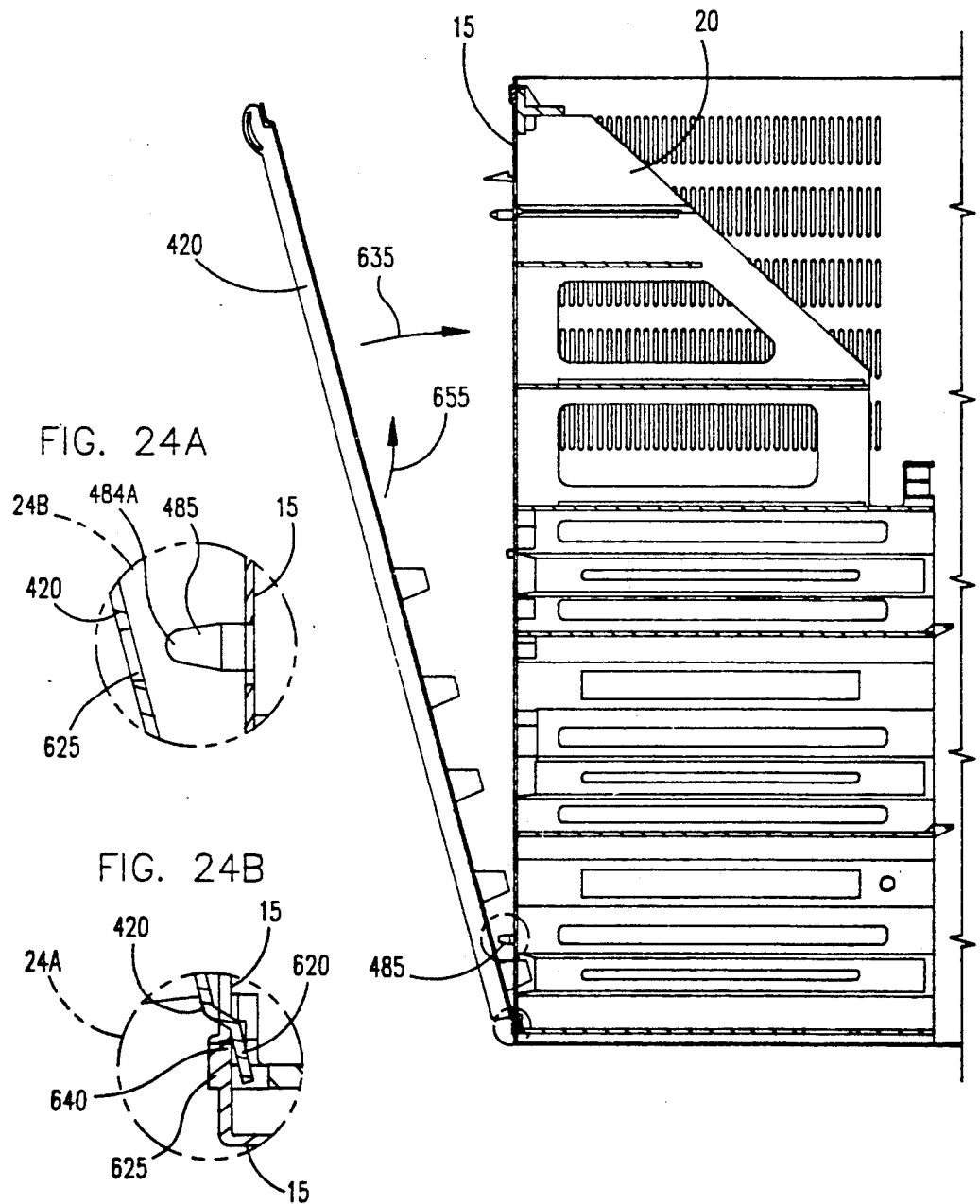

SUPPORT STRUCTURE FOR DEVICES IN A COMPUTER APPARATUS

BACKGROUND OF THE INVENTION

This invention relates in general to housings for computers and, more particularly, to an apparatus for housing devices such as disk drives and other media within computers.

In the past, removal of disk drives and other media from a personal computer was a rather complex process involving the removal of the cabinet or housing of the computer and the unmounting of one or more disk drives. Moreover the mounting structures for such disk drives were generally relatively small metallic mounts or brackets which are situated within the computer housing. The metallic nature of such mounts tend to contribute significantly to the cost of such a mounting arrangement. Computer housings and drive support mounts need to be structurally strong to protect the components of a computer from damage. For this reason, computer housings and associated components tend to be fabricated from metallic materials despite the cost of such materials. These metallic housings and drive mounts provide a simple although expensive way to ground disk drives and other media. In such computers, the disk drive is essentially directly grounded to the metallic disk drive mount.

BRIEF SUMMARY OF THE INVENTION

One object of the present invention is to provide a drive mounting structure which is fabricated from non-conductive or non-metallic materials.

Another object of the invention is to provide a drive mounting structure which contributes significantly to the structural integrity of the computer housing in which it is situated.

Another object of the present invention is to provide a computer housing structure in which drives and other devices are removable from the computer with a minimum of user effort.

In accordance with the present invention, a personal computer enclosure is provided which includes a substantially parallelepiped outer box having an interior. The box includes a surface having an opening for providing access to the interior of the box, such box including a plurality of mounting locations on the interior of the box. The enclosure includes an inner support structure situated within the outer box and further includes a plurality of bays for receiving respective disk drives therein. The bays of the structure communicate with the opening. The inner support structure is attached to the outer box at the mounting locations to provide structural integrity thereto.

The features of the invention believed to be novel are specifically set forth in the appended claims. However, the invention itself, both as to its structure and method of operation, may best be understood by referring to the following description and accompanying drawings.

BRIEF DESCRIPTION OF THE DRAWINGS

FIG. 1A is an exploded perspective view of the computer housing, retainer and grounding strip.

FIG. 2 is a front right side perspective view of the drive support structure.

FIG. 19B is a rear left side perspective view of the retainer of FIG. 19A.

FIG. 22 is a side cross sectional view which show a snap member of the drive support structure.

FIG. 23 is a side cross sectional view of the computer housing/drive support assembly showing the initial stage of installation of the retainer on the assembly.

FIG. 23a is a view of the lower hinge connection of FIG. 23.

FIG. 24 is a side cross sectional view of the computer housing/drive support assembly showing an intermediate stage of installation of the retainer on the assembly.

FIGS. 24a and 24b are views of the connection between the cabinet and cover.

FIGS. 24a-c are views of the cabinet and cover.

DETAILED DESCRIPTION OF THE INVENTION

FIG. 1A is an exploded perspective view of a personal computer assembly 10 which includes an enclosure or case 15 and a disk drive support structure 20. Case 15 is fabricated from electrically conductive material and exhibits a generally parallelepiped shape. More specifically, case 15 includes front and back members 15A and 15B, top and bottom members 15C and 15D, and a side member 15E. The remaining sixth side of the parallelepiped geometry of case 15 is open as seen in FIG. 1A. An open chamber 25 is thus formed within case 15 for receiving computer components and related structures such as disk drive support structure 20.

Figure 1B:
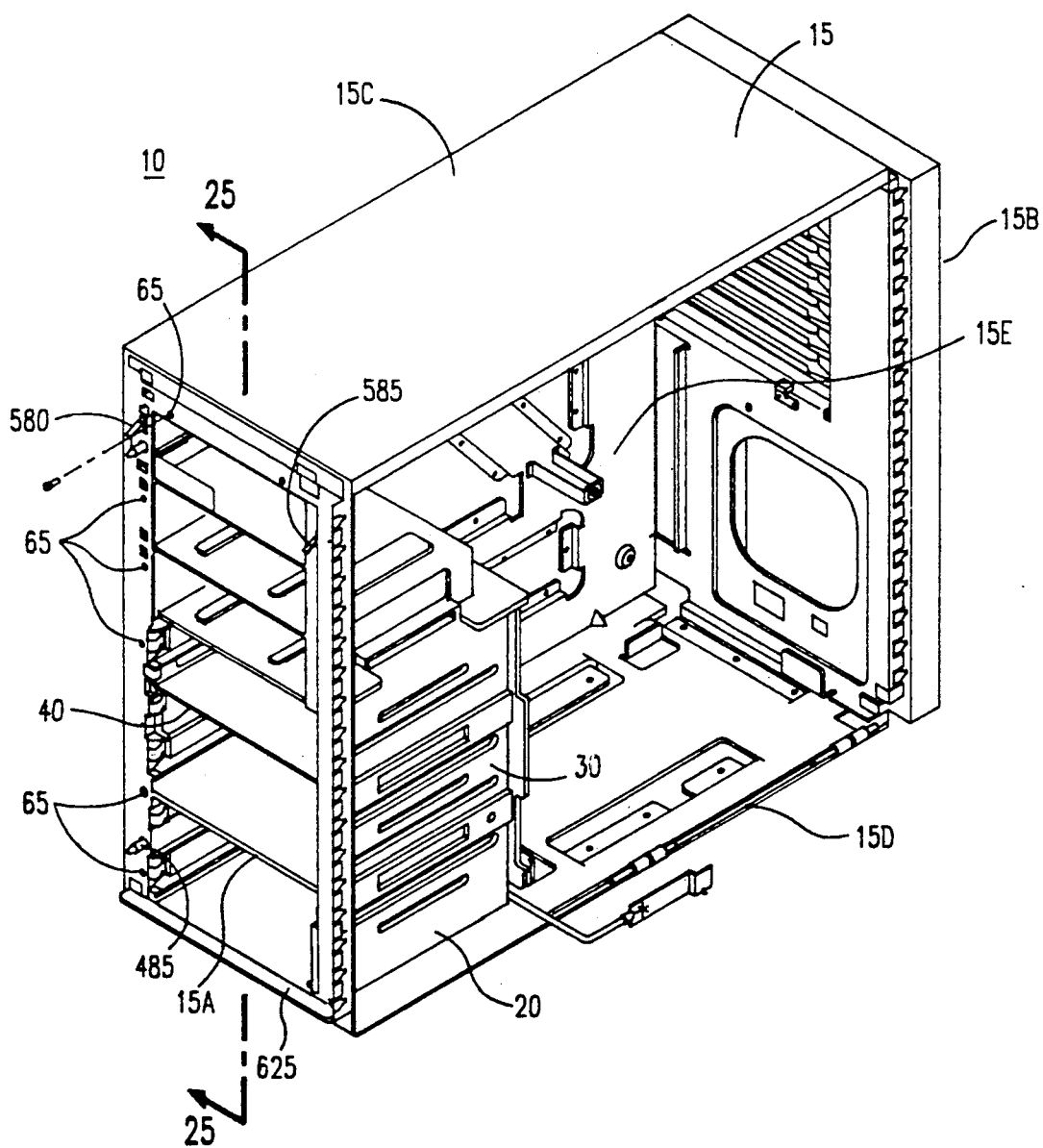
FIG. 1B is a perspective view of the computer housing including a drive support structure therein.

When installed in housing 15, as seen in FIG. 1B, disk drive support structure 20 spans substantially the entire interior surface of front member 15A and a substantial portion of the interior of case 15. Support structure 20 is anchored at several locations within case 15 and is configured to provide case 15 with additional structural integrity as will be discussed later in more detail.

Disk drive support structure 20 is fabricated from electrically insulative, substantially structurally rigid material, such as polycarbonate/ABS plastic, for example. Disk drive support structure 20 is illustrated in more detail in the front right side perspective view of FIG. 2. In the personal computer industry, the term "full height" disk drive is used to describe a particular size of disk drive and the term "half height" is used to describe a disk drive which exhibits a height which is approximately half the height of a "full height" disk drive. Both hard disk drives and floppy disk drives are available in either full height or half height versions.

Disk drive support structure 20 includes a plurality of bays for housing a plurality of disk drives stacked one atop the other. More specifically, structure 20 includes bay C1 and bay C2 which together form a bay C. Bay C is capable of housing a single full height disk drive or two half height disk drives in bays C1 and C2, respectively. Structure 20 further includes a bay D which is substantially similar to bay C. Bay D includes bays D1 and D2. Bay D is capable of housing a single full height disk drive or two half height disk drives in bays D1 and D2, respectively. Disk drive support structure 20 also includes a half height bay E as shown in FIG. 2 in this particular embodiment of the invention. Disk drive support structure 20 still further includes bays A and B in the upper portion of structure 20 as shown in FIG. 2.

In more detail, disk drive support structure 20 includes substantially parallel side walls 30 and 35. Structure 20 further includes a front wall 40 which is integrally molded to and which extends between side walls 30 and 35 as shown in FIG. 2 and in the right side rear perspective view of structure 20 shown in FIG. 3. Returning again to FIG. 2, it is seen that front wall 40 of structure 20 includes a plurality of openings 45, 50 and 55 which are aligned with bays C, D and E to provide paths through which disk drives can be installed in such chambers. Bays A and B have similar openings. From FIG. 2, it is seen that bays A, B, C, D and E are formed between substantially parallel shelves 20A, 20B, 20C, 20D, 20E and 20F which extend between side walls 30 and 35 of structure 20. Shelf 20F is the topmost shelf of shelves 20A–20F. Shelves 20A, 20B, 20C, 20D, 20E and 20F are stacked one above the other in spaced apart relationship to form bays A, B, C, D and E therebetween.

Figure 3:
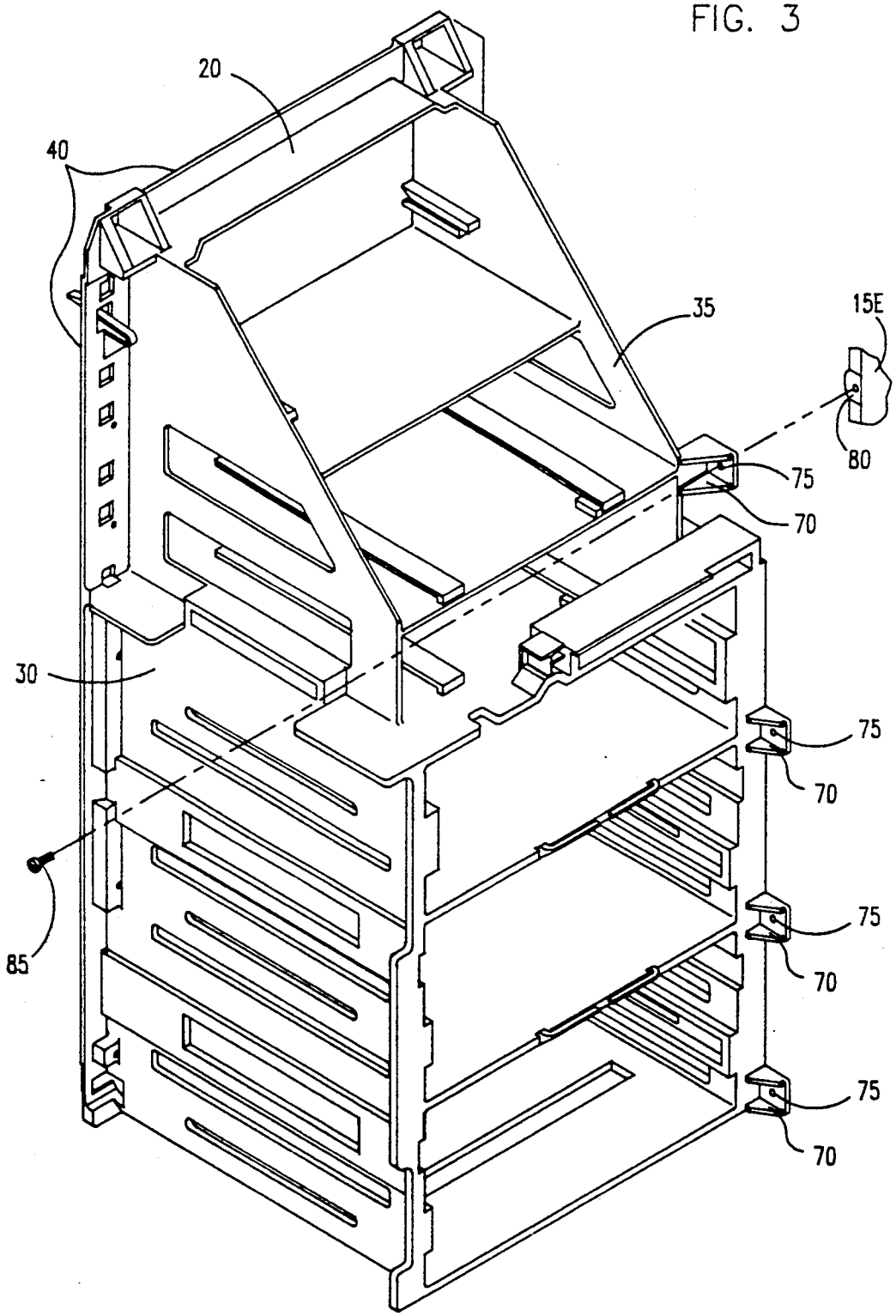
FIG. 3 is a rear perspective view of the drive support structure.

The periphery of front wall 40 includes a plurality of bolt holes 60 to enable disk drive support structure 20 to be securely bolted to the interior of case 15 as will now be described. As seen in FIG. 1B, front member 15A of case 15 includes a plurality of bolt receiving holes 65 which are aligned with corresponding bolt holes 60 in structure 20 when structure 20 is situated within case 15. Bolts 70 are then located in respective hole pairs 60–65 and fixed with appropriated fasteners to hold front wall 40 of structure 20 firmly to front member 15A of housing 15, Returning again to FIG. 3, it is seen that disk drive support structure 20 includes four mounting pads 70, each including a respective hole 75. When structure 20 is situated in the interior of case 15 as in FIG. 1B, holes 75 of structure 20 align with corresponding respective threaded holes 80 in side member 15E. To increase clarity, a portion of side member 15E adjacent a representative hole 80 is shown in FIG. 3 at approximately four times actual size.

Figure 4:
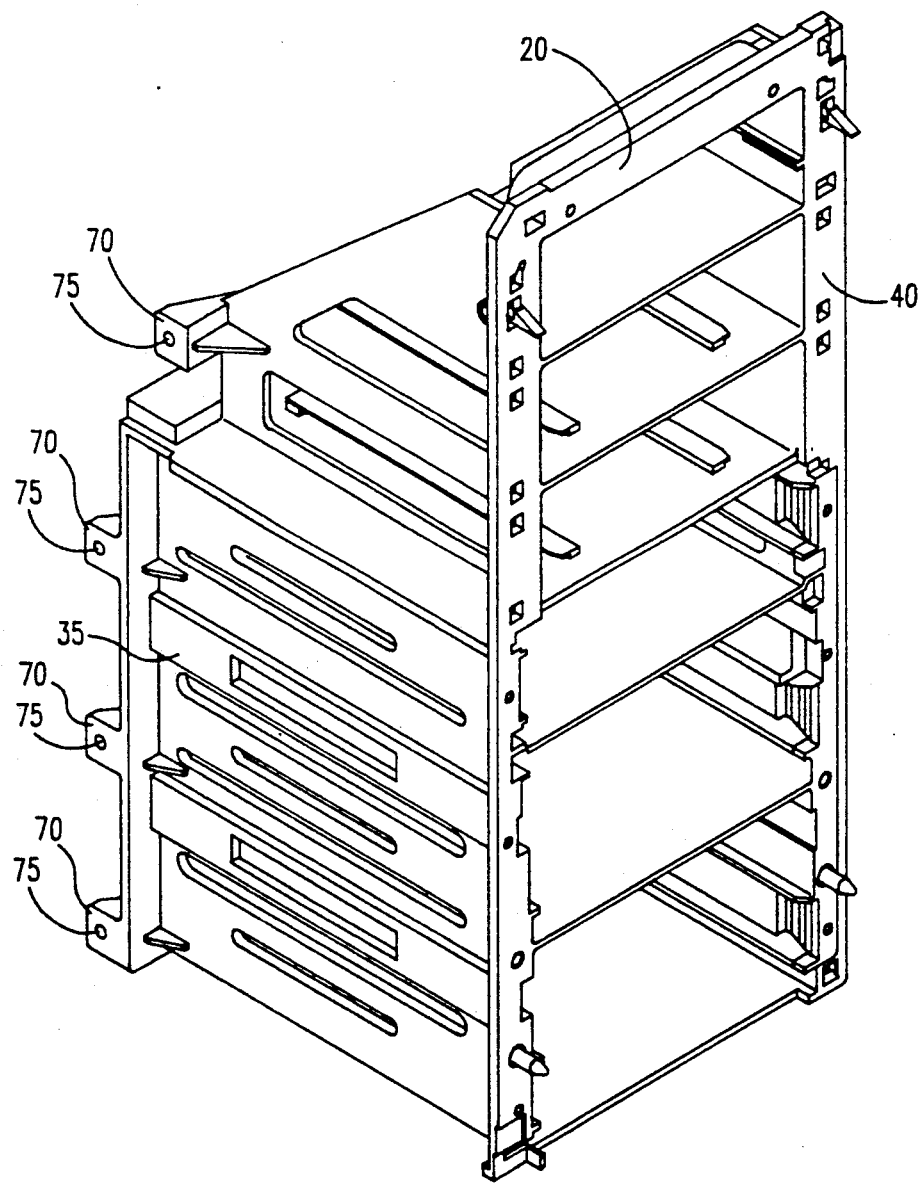
FIG. 4 is a front left side perspective view of the drive support structure.

A left side perspective view of structure 20 is shown in FIG. 4 to more clearly depict mounting pads 70, holes 75 and side wall 35 of disk drive support structure 20. Respective threaded bolts 85 are screwed through each of hole pairs 75–80 to securely hold side wall 35 of structure 20 to side member 15E of case 15.

As seen in FIG. 1B, drive support structure 20 extends across the majority of the interior surface of front member 15A both laterally and longitudinally. In this particular embodiment, support structure 20 extends along the entirety of the interior surface of front member 15A. Moreover, support structure 20 is fixedly or rigidly attached to two substantially perpendicular members of case 15, namely front member 15A and side member 15E, as describe above.

When disk drive support structure 20 is mounted within case 15 in this manner, the structural integrity of case 15 is substantially increased. Support structure 20 houses and supports multiple disk drives while simultaneously improving the substantial structural integrity of case 15. More specifically, the multi-chamber nature of structure 20 acts to reinforce case 15 and enhances the rigidity of case 15 against moments of force which would otherwise cause case 15 to undesirably twist and deform.

Figure 5:
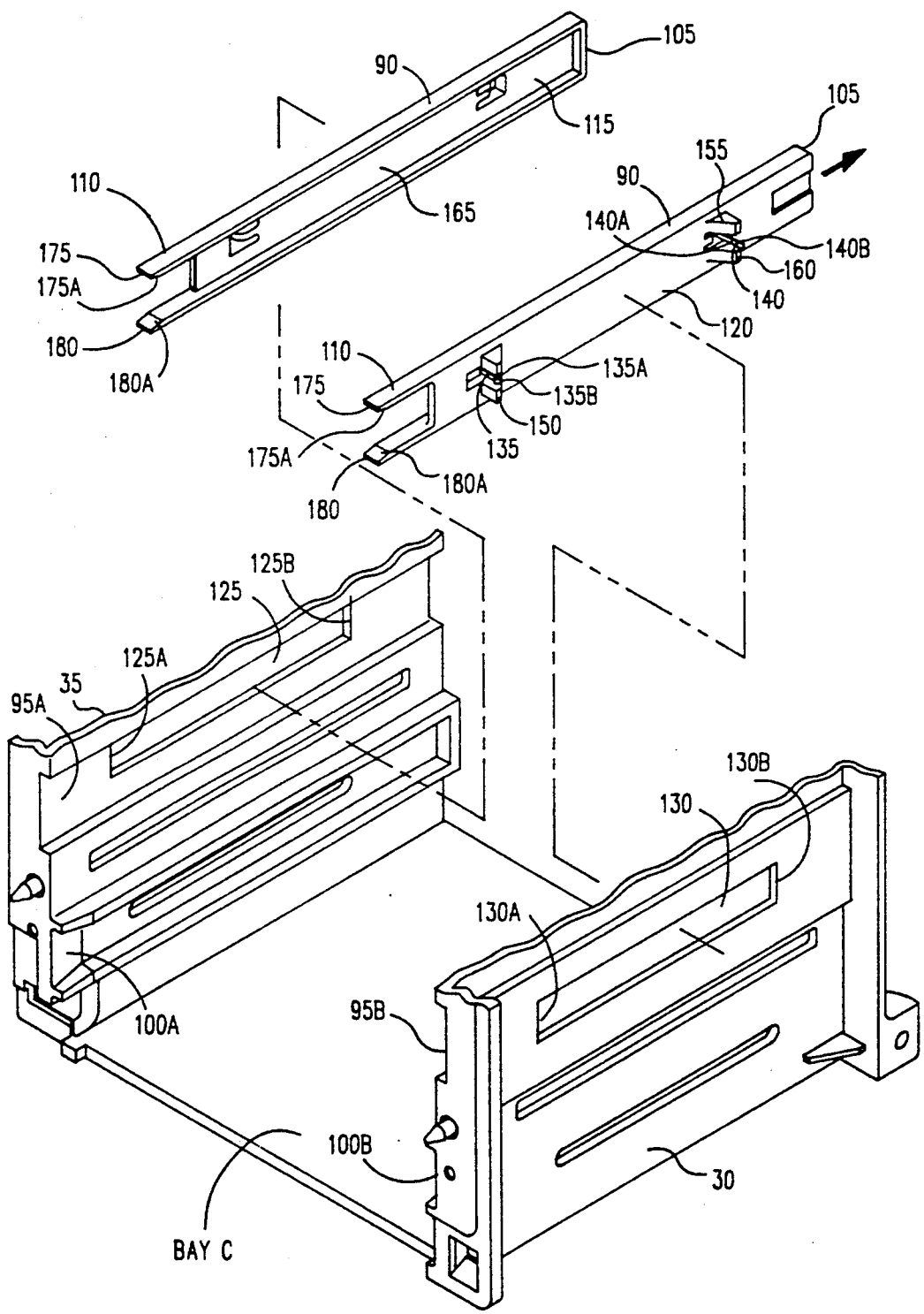
FIG. 5 is a perspective view of a drive support structure bay showing removable guides.

FIG. 5 is an enlarged and exploded right side perspective view of the lower bay C portion of disk drive support structure 20, the entirety of which was shown earlier in FIG. 2. Bay D is substantially identical to bay C and thus the following discussion of bay C will apply to bay D as well. Half height drives or full height drives generally have respective plastic rails mounted to the two opposed side surfaces thereof to permit such drives to slide in and out of fixed, non-removable rail guides which are typically situated within a computer. It is desirable to have maximum flexibility in the choice of placement of one full height or two half height drives in bays C and D. Moreover, it is desirable to provide a reasonable amount of clearance or sway space between the sides of a hard disk mounted in a bay to avoid or reduce shock damage to such hard drives.

Bay C is provided with removable drive support guides 90 as shown in FIG. 5. The upper portion of bay C includes support guide receiving channels 95A and 95B located in side walls 35 and 30, respectively, each of which is capable of receiving a respective removable support guide 90 therein as will be discussed subsequently in more detail. The lower portion of bay C includes rail receiving guides 100A and 100B which are integrally formed into side walls 35 and 30, respectively, as shown in FIG. 5. A pair of guide rails (described later) are mounted on the opposed sides of a full height or half height drive such that the rails can be slid into receiving guides 100A and 100B. Support guides 90 mounted in guide receiving channels 95A and 95B can receive a half height drive with rails mounted as described above providing a full height drive is not mounted in receiving guides 100A and 100B therebelow.

In this particular embodiment, support guides 90 are substantially rectangular in shape and include opposed ends 105 and 100, and further include opposed sides 115 and 120. Guide receiving channels 95A and 95B include slots 125 and 130 laterally oriented along portions of such channels for facilitating the attachment of support guides 90 to side walls 35 and 30 as will now be described.

Slot 125 includes opposed ends 125A and 125B. Slot 130 includes opposed ends 130A and 130B. Support guides 90 include flexible snaps or latches 135 and 140 which are spaced apart by a predetermined distance approximately equal to the length of slots 125 and 130. For purposes of example, the placement of a support guide 90 in slot 130 will now be discussed although it should be appreciated that a support guide 90 can be situated in slot 125 as well using the same technique. A pair of stops 145 and 150 are situated adjacent latch 135 as shown in FIG. 5. Similarly, a pair of stops 155 and 160 are situated adjacent latch 140. When support guide 90 is placed in position in channel 95B, stop pair 145-150 is situated adjacent slot end 130A and stop pair 155-160 is situated adjacent slot end 130B so as to prevent substantial lateral movement of support guide 90 within channel 95B.

Latch 135 includes a flexible arm 135A extending from guide 90. A catch or protrusion 135B is situated at the end of arm 135A such that as stop pair 145-150 of guide 90 is placed in slot 130, arm 135A deflects until protrusion 135B catches and holds to slot end 130A. In a similar manner, latch 140 includes a flexible arm 140A extending from guide 90 and a catch or protrusion 140B at the end of arm 140. Arm 140B similarly deflects when stop pair 155-160 of guide 90 is placed in slot 130. Protrusion 140B then catches on end 130B to hold guide 90 in position in slot 130 of channel 95B. From the above, it will be appreciated that latches 135 and 140 are living snap members which are integrally formed into guide 90. Support guide 90 is easily removed from channel 95B by pulling guide 90 away from slot 130 with sufficient force to deflect arms 135A and 140A and overcome the snap action of latches 135 and 140.

Side 115 of guide 90 includes a channel 165 for receiving a disk drive rail or other sliding structure. When drive support guides 90 are removably mounted in channels 95A and 95B as described above, a half height disk drive having two rails mounted on the respective sides thereof as described earlier is readily mounted in the upper portion of bay C by sliding such rails into the channels 165 of support guides 90.

To facilitate the sliding of a rail into channel 165 of support guide 90, guide 90 includes a pair of protrusions 175 and 180 which are flared apart at ends 175A and 180A to enhance the alignment of a rail within channel 165 as the rail initially approaches and engages channel 165.

Figure 6:
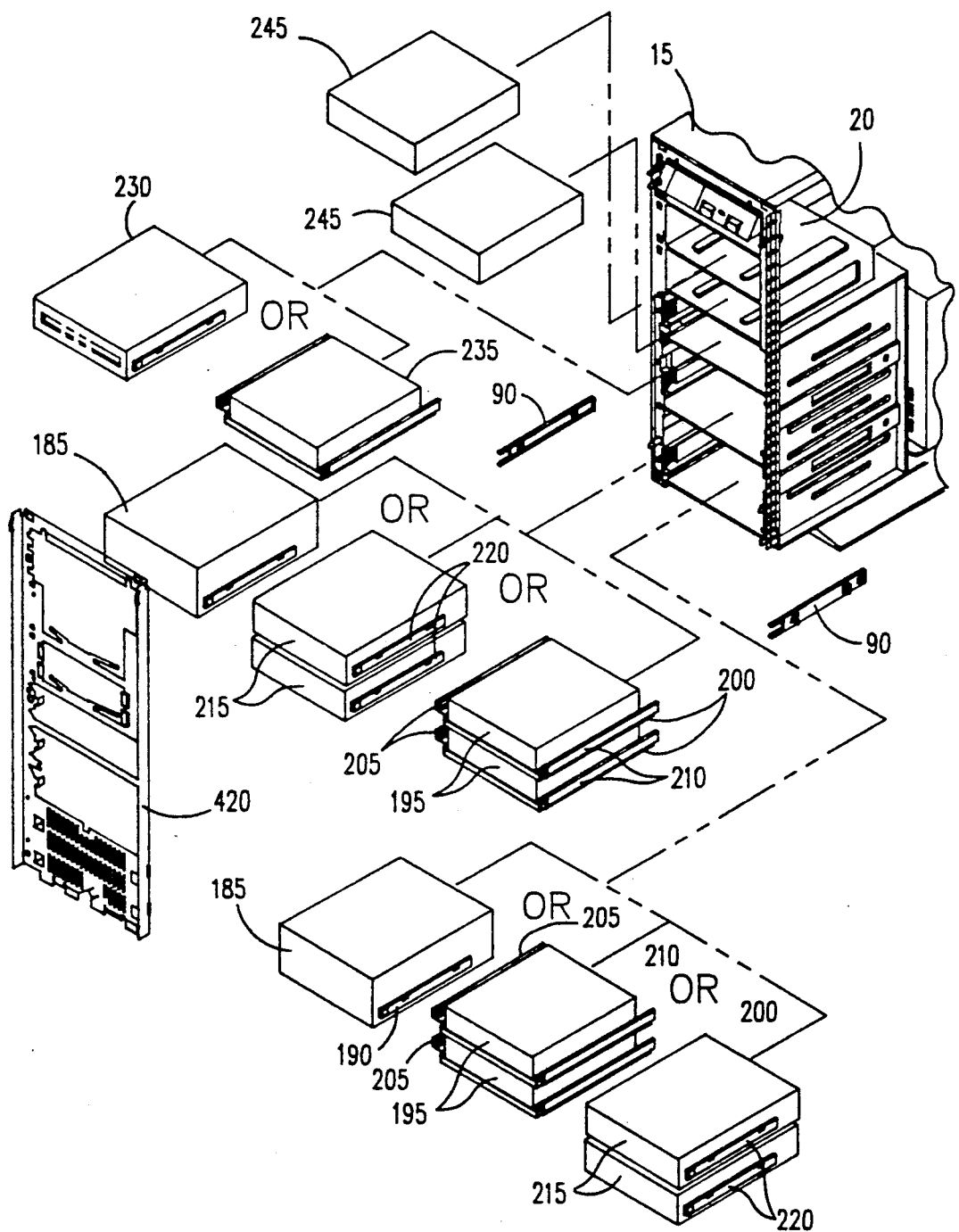
FIG. 6 is an exploded perspective view showing a plurality of disk drive configurations which may be installed in the drive support structure.

FIG. 6 is an exploded perspective view of the front portion of personal computer assembly 10 which demonstrates the different drive combinations which drive support structure 20 is capable of housing. To promote clarity, the lower portion of drive C is designated bay C1 and the upper portion of bay C is designated bay C2. In a like manner, the lower portion of drive D is designated bay D1 and the upper portion of bay D is designated bay D2.

At this particular stage in disk drive technology, most disk drives exhibit one of two different standard heights (full height or half height) and one of two different standard widths (5.25 inch or 3.5 inch). Disk drive support structure 20 supports all of these types of drives as seen in the examples portrayed in FIG. 6. While bays C and D of structure 20 are full height bays, bays C1, C2, D1 and D2 are half height bays.

To accommodate a full height drive 185 in bay C, snap-in support guides 90 are removed from channels 95A and 95B (not fully shown) in upper bay C2. Then, rails 190 and 190', situated on the opposed sides of drive 185, are slid into receiving guides 100B and 100A, respectively, as seen more clearly in the front view of chamber C shown in FIG. 7.

To accommodate two half height 3.5 inch drives 195 in bay C, snap-in support guides 90 are installed in channels 95A and 95B of upper bay C2. As seen in FIG. 6 and more clearly in the front view of chamber C in FIG. 8, each of drives 195 is installed in an adapter tray 200 which includes integral conductive side rails 205 and 210 as will be discussed later in detail. In lower bay C1, side rails 205 and 210 slide into receiving guides 100A and 100B. In upper bay C2, side rails 205 and 210 slide into respective channels 165 of support guides 90.

Figure 8:
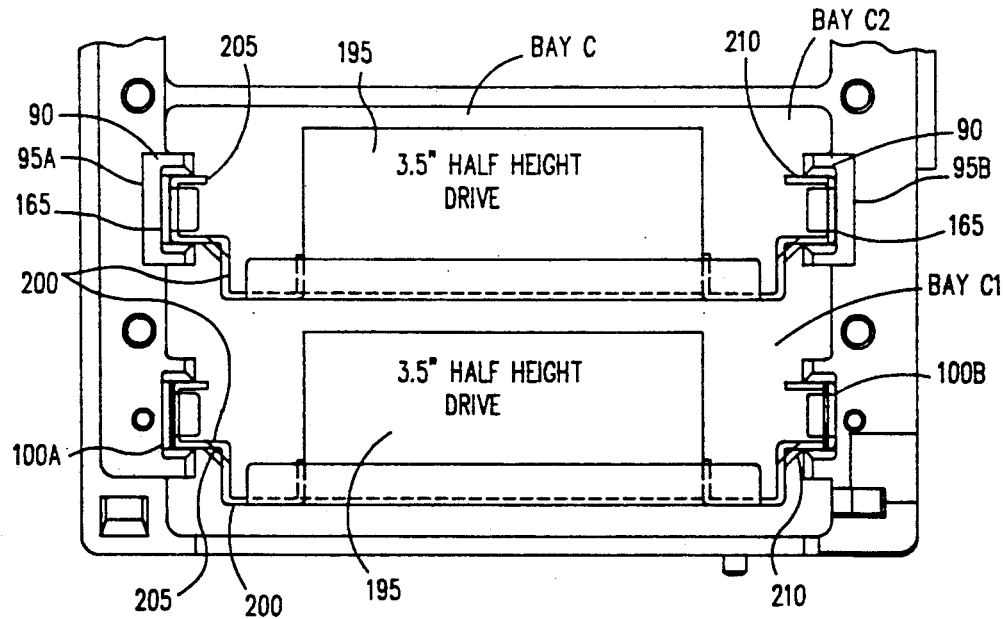
FIG. 8 is a front view of two first size half height drives fitted with adapter trays and installed in the drive support structure.
Figure 9:
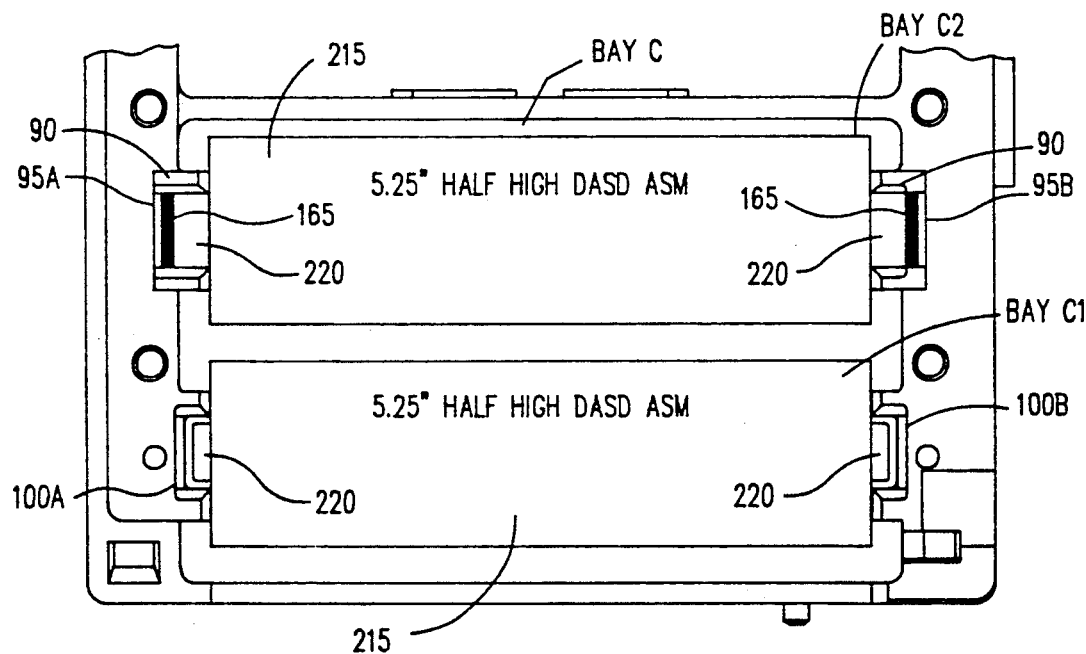
FIG. 9 is a front view of two second size half height drives fitted with adapter trays and installed in the drive support structure.

To accommodate two half height 5.25 inch drives 215 in bay C, snap-in support guides 90 are installed in channels 95A and 95B of upper bay C2 in the same manner shown in FIG. 8. Returning momentarily to FIG. 6, a pair of rails 220 is attached to the respective opposite sides of drives 215, only one rail 220 of which is visible on each drive 215 of FIG. 6. As seen in the front plan view of bay C in FIG. 9, in lower bay C1, rails 220 of drive 215 slide into receiving guides 100A and 100B. In upper bay C2, rails 220 of remaining drive 215 slide into respective channels 165 of support guides 90.

Returning again to FIG. 6, it is noted that bay D is substantially similar to bay C. Thus, bay D can likewise accommodate a full height disk drive 185, two half height disk drives 215 or two adapter tray-mounted disk drives 195 in a manner similar to bay C.

As indicated in FIG. 6, bay E can accommodate either a single half height drive 230 which is similar to drive 215 or alternatively accommodate a single adapter tray-mounted half height drive 235 which is similar to drive 195. The rails on either drive 230 or drive 235 are situated in respective rail receiving guides 225A and 225B (depicted in FIG. 10) which are substantially similar to rail receiving guides 100A and 100B of bays C and D.

Figure 10:
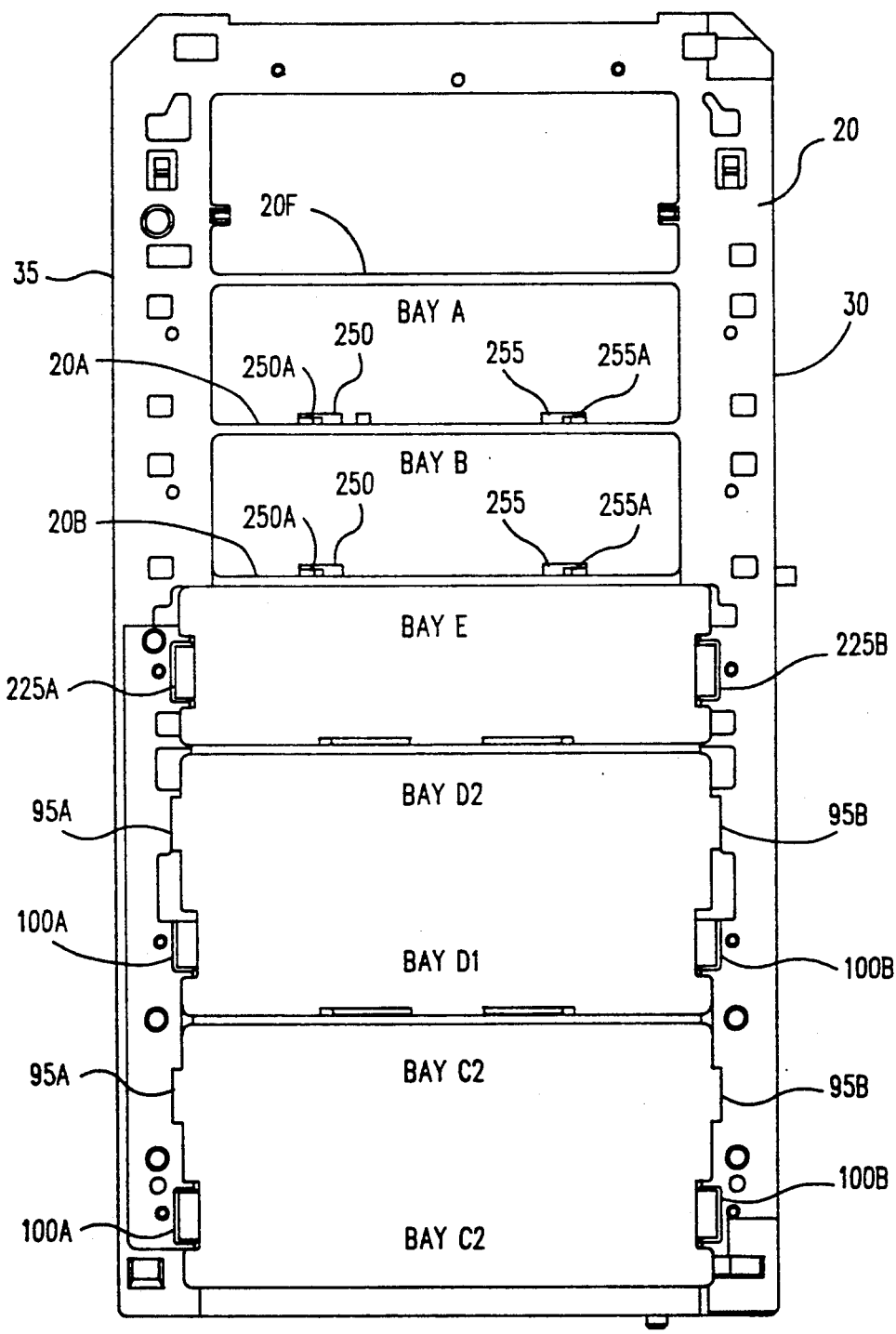
FIG. 10 is a front view of the drive support structure.

As indicated in FIG. 6, each of bays A and B are capable of receiving a disk drive 245. As shown in FIG. 10, a pair of disk drive mounts 250 and 255 are situated on shelf 20A of bay A. Mounts 250 and 255 are inverted L structures facing opposite directions. Mounts 250 and 255 include arm portions 250A and 255A. Two mating flanges (not shown) attached to disk drive 245 are slid into the region formed between arm 250A and shelf 20A, and the region formed between arm 255A and shelf 20A, respectively, to hold drive 245 to shelf 20A in bay A.

Bay B also includes disk drive mounts 250 and 255 on shelf 20B thereof. Mounts 250 and 255 in bay B are capable of holding a disk drive 245 to shelf 20B in the same manner described above. Other electrical equipment, such as switches, keylocks, displays and indicator lights, for example, or other devices may be installed in the region above shelf 20F and between side walls 30 and 35.

Although in the discussion of disk drive support structure 20 above, the mounting and housing of full height, half height, 5.25 inch and 3.5 inch disk drives have been discussed, those skilled in the art will appreciate that the present invention is not limited to these particular heights and sizes. Rather, the dimensions of structure 20 may be readily modified to accommodate disk drives of other sizes as well. Moreover, although in the above description, support structure 20 has been referred to as a disk drive support structure, structure 20 can support and house other electrical devices as well, for example, tape drives, removable hard disks, optical drives and the like.

Figure 11:
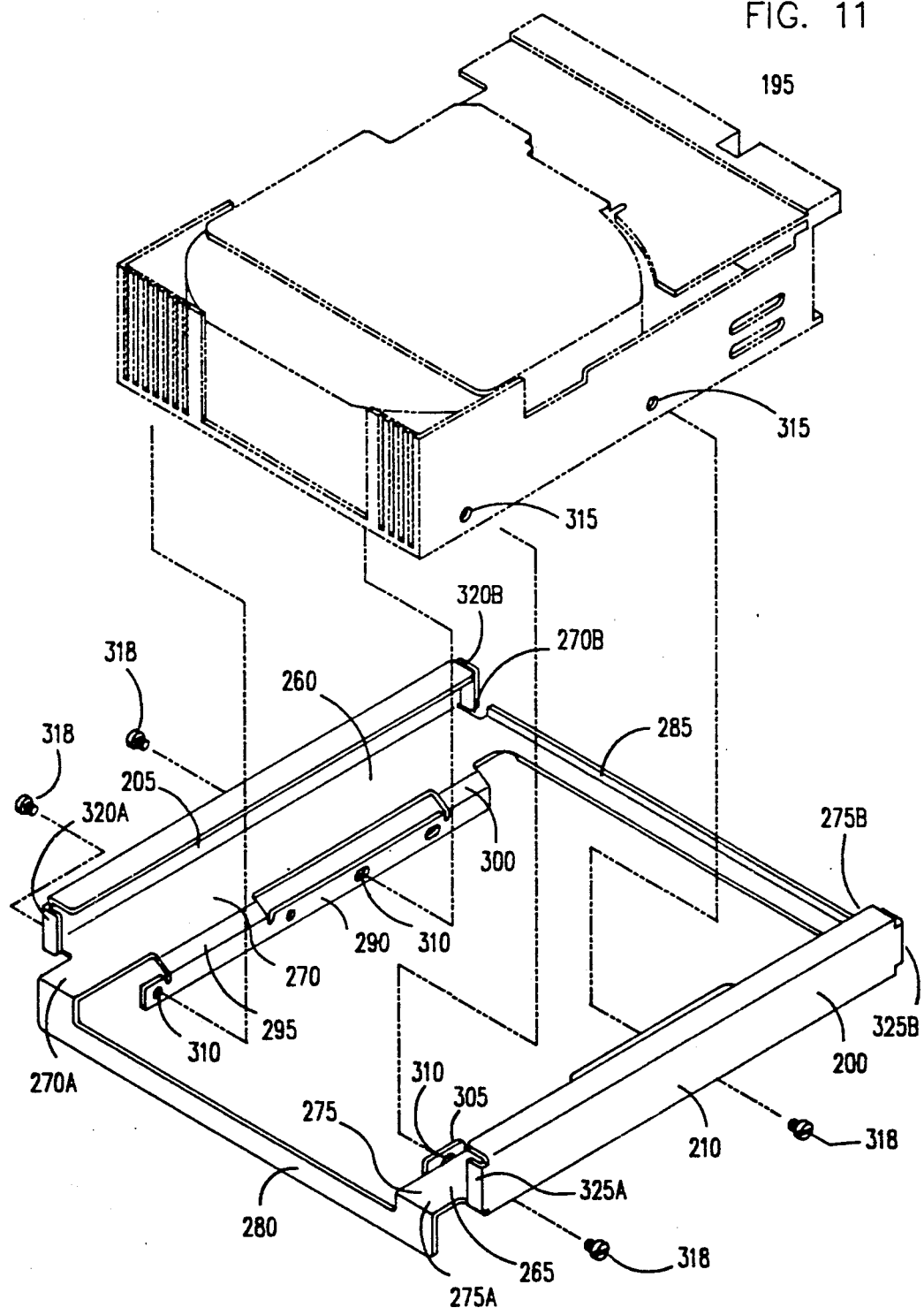
FIG. 11 is an exploded perspective view of a drive installed on the adapter tray.

FIG. 11 is a front right side perspective view of the disk drive adapter tray 200 which was mentioned earlier in the discussion of FIG. 8. Tray 200 is used to adapt a disk drive or other device which is substantially narrower than bays C, D or E to fit in such bays. As discussed earlier, bays C, D and E are sufficiently wide to accommodate 5.25 inch media therein. Adapter tray 200 permits a narrower media device such as a 3.5 inch drive to be installed between rail receiving guide pairs 100A/100B and 225A/225B or between support guides installed in channels 95A/95B, these locations being shown in FIG. 8 and FIG. 10.

Returning again to FIG. 11, it is seen that adapter tray 200 exhibits a substantially rectangular framelike shape. Tray 200 is fabricated from electrically conductive material. Adapter tray 200 includes side members 260 and 265, each having a substantially flat base 270 and 275, respectively. Base 270 includes opposed ends 270A and 270B. Base 275 includes opposed ends 275A and 275B. A connecting bar 280 is integrally formed from the same material as side members 260 and 265. Connecting bar 280 extends between ends 270A and 275A of bases 270 and 275. Connecting bar 280 is bent downward to form an angle of approximately 90 degrees with respect to the plane of bases 270 and 275. A connecting bar 285 joins ends 270B and 275B of bases 270 and 275. Connecting bar 285 is formed integrally from the same material as bases 270 and 275.

A drive carriage member 290 is joined to base 260 via arms 295 and 300. Carriage member 290 extends downwardly from base 270 as shown in FIG. 11. Another drive carriage member 305 (partially shown in FIG. 11) which is substantially similar to carriage member 290 extends downwardly from base 275. Carriage members 290 and 305 include through-holes 310 which align with corresponding holes 315 in disk drive 195 when drive 195 is situated between carriage members 290 and 305. When drive 195 is so situated, screws 318 are placed in through holes 310 and holes 315 to hold drive 195 in position within adapter tray 200 thus forming an electrical connection between drive 195 and adapter tray 200.

Adapter tray 200 includes side rails 320 and 325 which are integrally formed into bases 270 and 275, respectively. Side rails 320 and 325 are formed from the same electrically conductive material as bases 270 and 275. Side rail 320 includes opposed ends 320A and 320B. Side rail 325 includes opposed ends 325A and 325B. As seen in FIG. 11, side rails 320 and 325 are bent upwardly with respect to bases 270 and 275, respectively. Moreover, side rails 320 and 325 are oriented substantially perpendicularly to bases 270 and 275, respectively.

Connecting member 280 acts as a convenient handle for the user to grasp when installing adapter tray 200 within a disk drive bay. To actually place adapter tray 200/drive 195 in a disk drive bay such as bay C1, for example, the user grasps connecting member (handle) 280 and slides side rails 320 and 325 into rail receiving guides 100A and 100B, respectively. Side rails 320 and 325 are spaced apart by a predetermined distance selected such that rails 320 and 325 can slidably engage and ride in rail receiving guides 100A and 100B.

Figure 7:
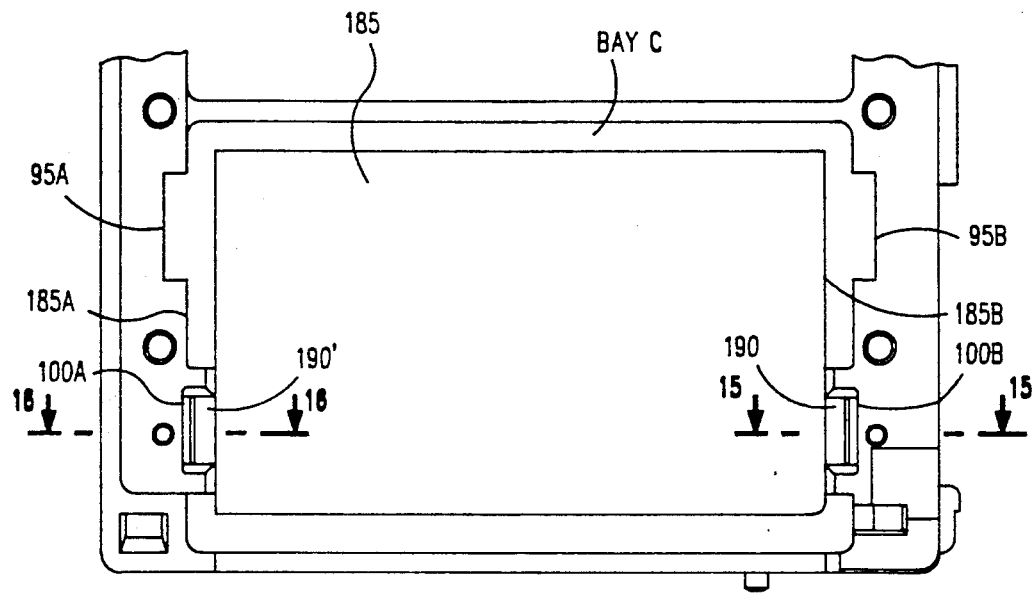
FIG. 7 is a front view of a full height drive installed in the drive support structure.
Figure 12:
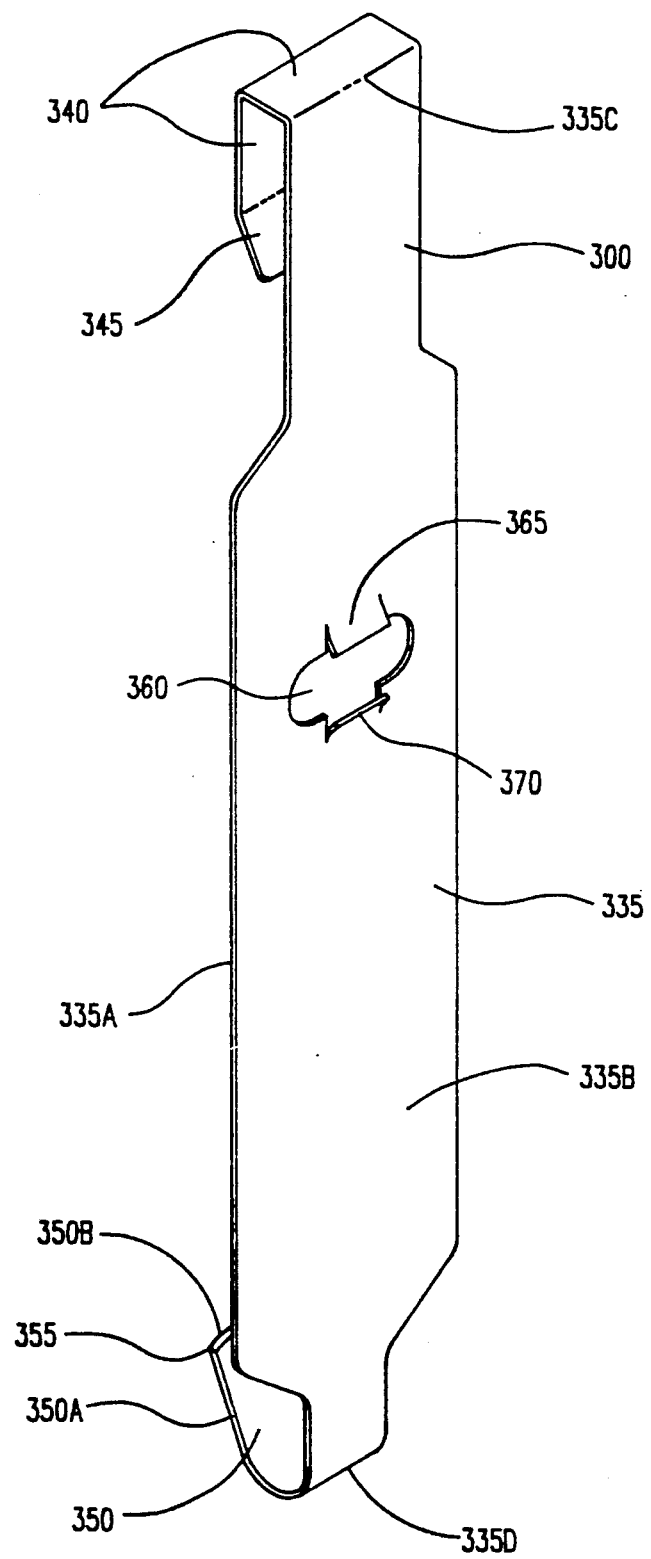
FIG. 12 is a perspective view of the ground spring for a rail mounted device.
Figure 13:
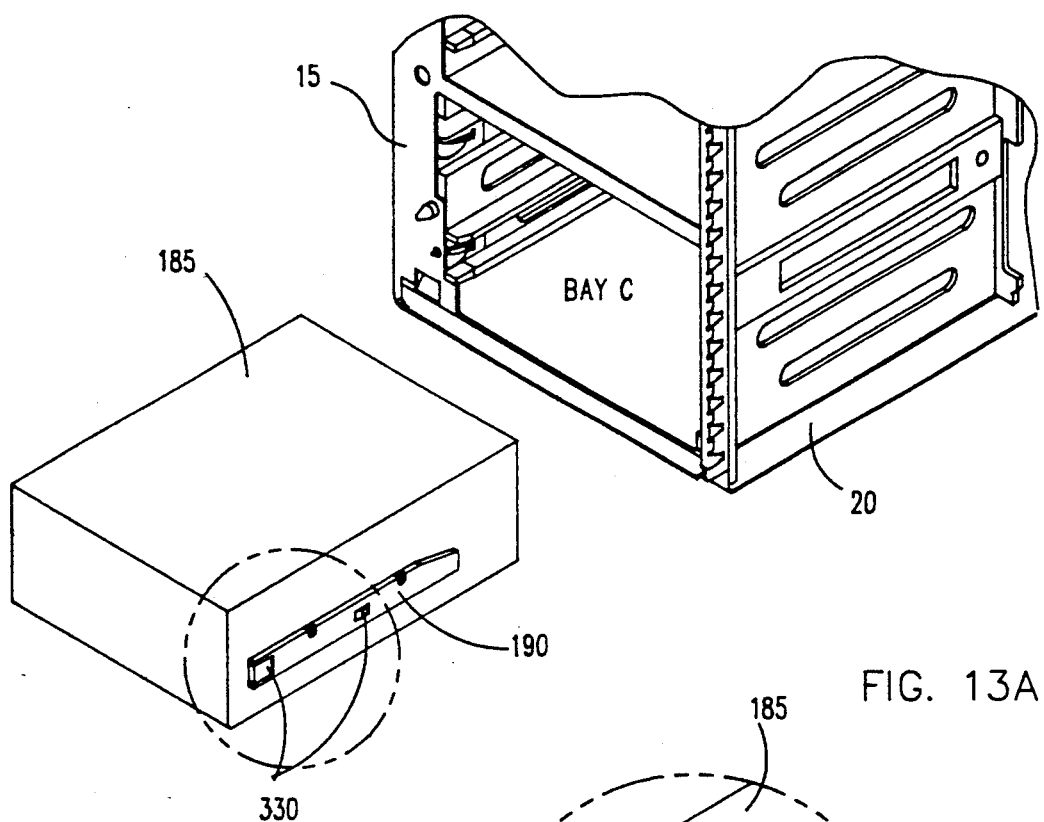
FIG. 13 is an exploded view of a rail mounted device employing the ground spring of FIG. 12 prior to installation of the device in the drive support structure.
Figure 13A:
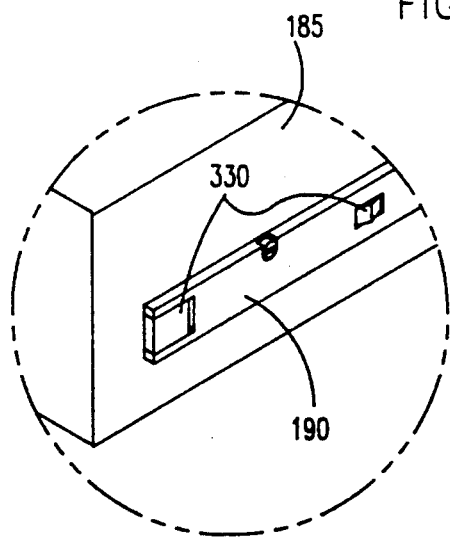
FIG. 13a is a view of the area circled in FIG. 13.

FIG. 12 is a back side perspective view of a ground spring 330 which is mountable on a removable side rail 190 of FIG. 6 (or 220 of FIG. 6) to permit grounding of a drive 185 of FIG. 7 (or drive 215 of FIG. 9) when such drive is mounted in the non-conductive drive support structure 20 of FIG. 1A. FIG. 13 is provided to illustrate the spatial relationship of ground spring 330, removable side rail 190 and drive 185.

Returning again to FIG. 12, ground spring 330 includes a flat main body or shank 335 having opposed back and front surfaces 335B and 335A, respectively, and further including opposed ends 335C and 335D. Ground spring 330 is fabricated from relatively thin electrically conductive material such as stainless steel, although other conductive materials such as beryllium copper, phosphor bronze, or high tensile strength spring steel may be employed. As seen in FIG. 12, ground spring 330 includes a wrap-around spring portion 340 integrally formed at spring main body end 335C. Wrap-around spring portion 340 includes a flange 345 which tapers inwardly toward main body 335.

A side spring contact 350 is integrally formed at the opposite main body end 335D. Side spring contact 350 is a flange which slopes away from spring main body 335 at flange portion 350A and then bends back toward main body 335 at flange portion 350B so as to form an apex 355 between flange portions 350A and 350B. It is this apex 355 which is used for electrical contact to an electrically conductive drive support chassis should such a chassis ever be used in place of the electrically non-conductive drive support structure 20 described herein.

Figure 14:
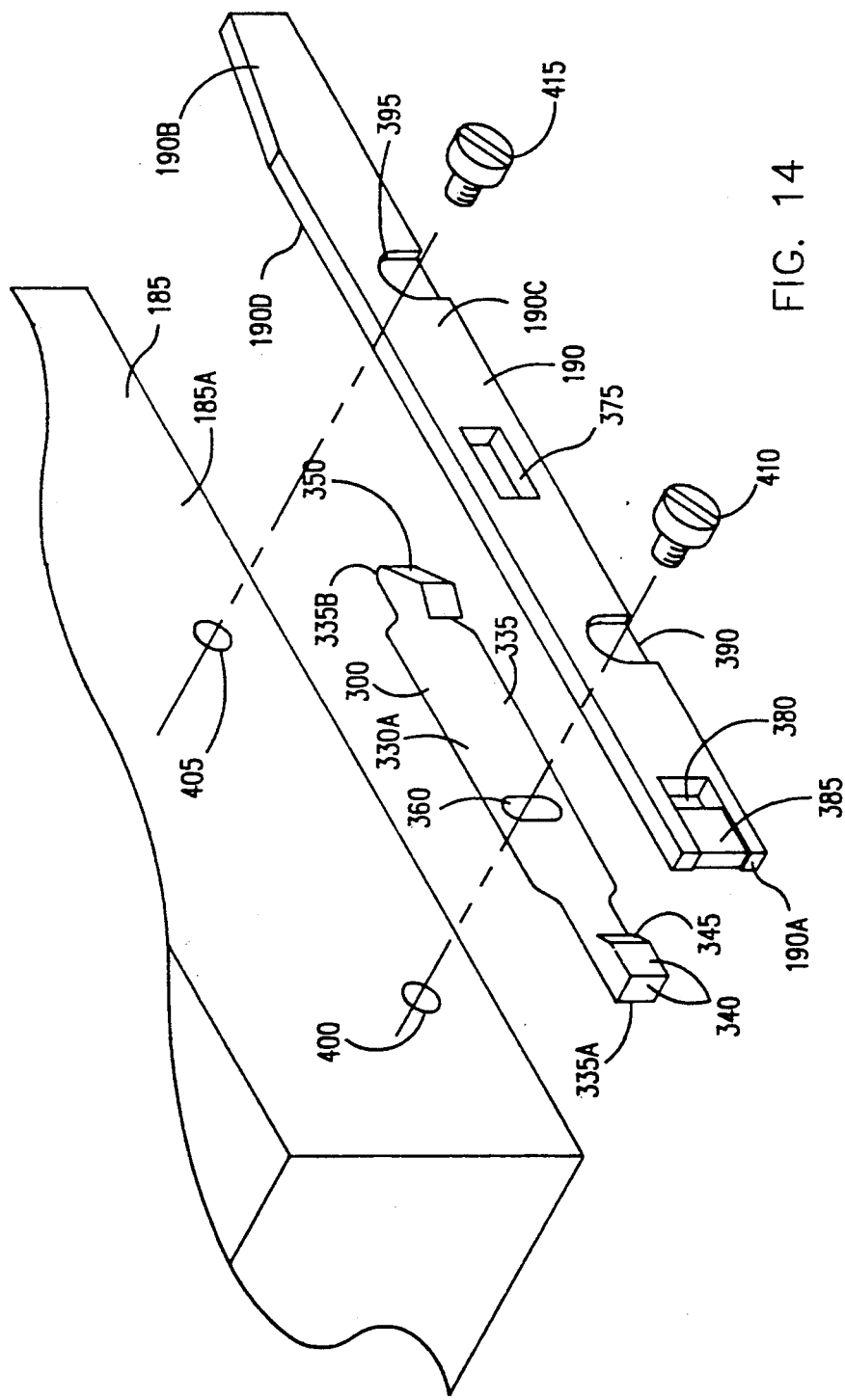
FIG. 14 is an exploded perspective view of the ground spring, rail and rail mounted device.

A drive mounting screw receiving opening 360 is situated in main body 335 as shown in FIG. 12 and in the exploded perspective view of the drive 185, rail 190 and ground spring 330 assembly shown in FIG. 14. A pair of teeth or tangs 365 and 370 (see FIG. 12) are situated adjacent opening 360 such that when ground spring 330 is mounted on rail 190 and screwed to metallic drive side surface 185A, tangs 365 and 370 dig into drive side surface 185A to form an electrical connection between grounding spring 330 and drive 185 as indicated in FIG. 14.

To enable a better appreciation of the operation of ground spring 330 which is mountable in removable rail 190, rail 190 is now described in more detail using the exploded perspective view of FIG. 14. Rail 190 is fabricated from electrically non-conductive material such as plastic materials. Rail 190 is a substantially flat strip including opposed ends 190A and 190B, and further includes opposed side surfaces 190C and 190D. Rail 190 includes as opening 375 appropriately shaped to receive side spring contact 350 therein when ground spring 330 is installed on rail 190. For example, opening 375 may be rectangular in shape. Rail 190 includes an opening 380 which is appropriately shaped to receive flange 345 of wrap-around spring portion 340 when ground spring 330 is installed on rail 190. Rail 190 further includes a recessed portion 385 which wraps around rail end 190A from opening 380 on rail side surface 190C to opening 380 on opposite rail side surface 190D. Recessed portion 385 receives wrap-around spring portion 340 therein.

Rail 190 further includes a screw hole 390 which aligns with opening 360 of ground spring 330 when ground spring 330 is mounted on rail 190. As shown in FIG. 14, rail 190 includes another screw hole 395 for facilitating mounting of rail 190 to drive 185. Drive 185 includes screw holes 400 and 405 which align with rail screw holes 390 and 395, respectively, when rail 190 is mounted on drive 185.

To actually mount ground spring 330 on rail 190, flange 345 is pulled apart from main body 335 against spring action a sufficient distance to permit flange 345 to slide along the recessed portion 385 on rail side surface 190C until flange 345 engages opening 380 and wrap around portion 340 rests in recessed portion 385. At substantially the same time, spring contact 350 is placed in opening 375. A screw 410 is then inserted through hole 390, opening 360 and drive hole 400. Screw 410 is then turned until rail 190/spring 330 is held tightly to drive 185. A screw 415 is inserted through hole 395 and threaded into drive hole 405 and is similarly tightened.

Figure 15:
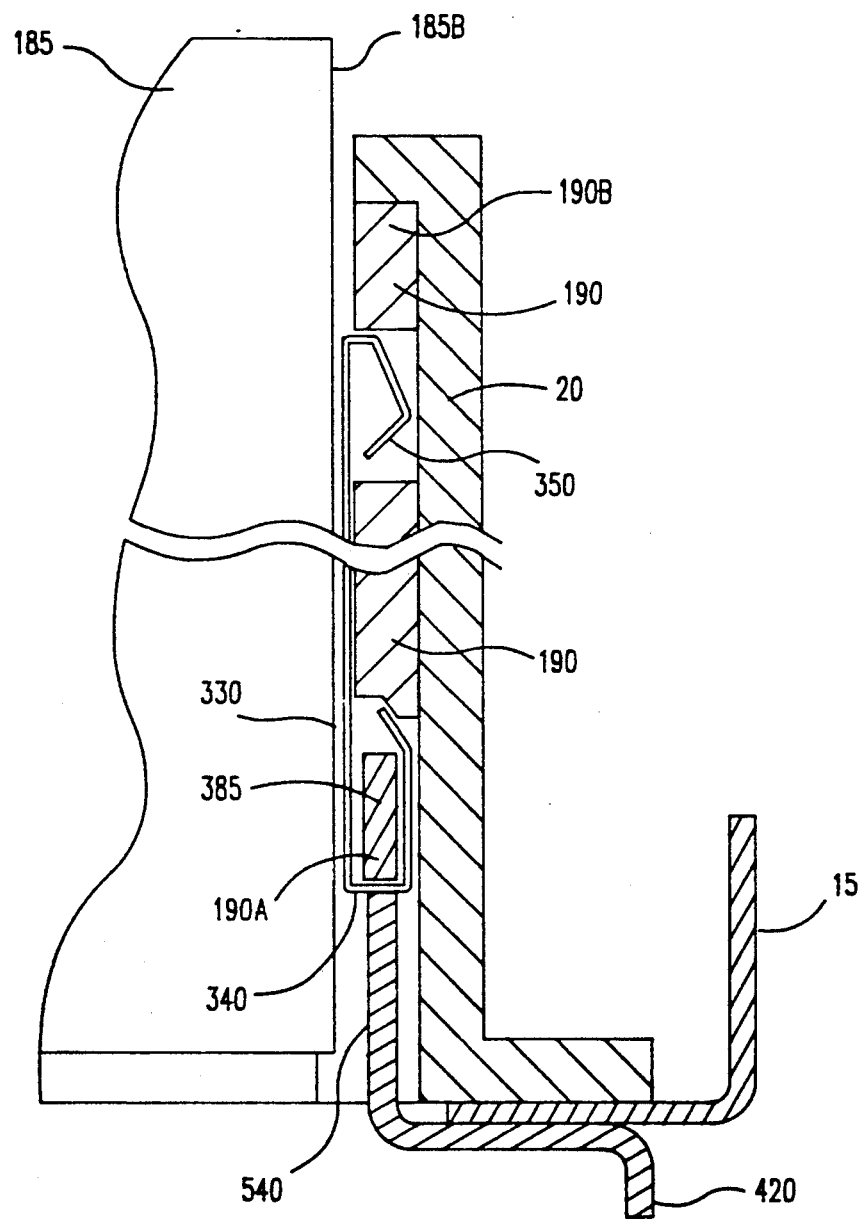
FIG. 15 is a bottom cross sectional view of the ground spring installed on a rail mounted on a drive, such cross section being taken along section line D—D of FIG. 7.

FIG. 15 is a bottom cross sectional view of ground spring 330 installed on a rail 190 which is mounted on drive 185, such drive 185 being installed in non-conductive drive support structure 20 within housing 15. The cross section shown in FIG. 15 is taken along section line D—D of FIG. 7 and additionally shows a portion of an electrically conductive drive retainer 420 in contact with ground spring 330 and housing 15. In this manner drive 185 is electrically connected to case 15 to establish a ground for drive 185. Thus ground spring is usable in two different modes, first as a way to provide a connection between drive 185 and case 15 via wrap around portion 340 when a non-conductive drive support structure such as structure 20 is used to house a drive 185, and alternatively as a way to provide a connection between drive 185 and a conductive drive support structure (not shown) via spring contact 350 which would contact such a conductive drive support structure if used in place of support structure 20. Retainer 420 is discussed later in more detail.

Figure 16:
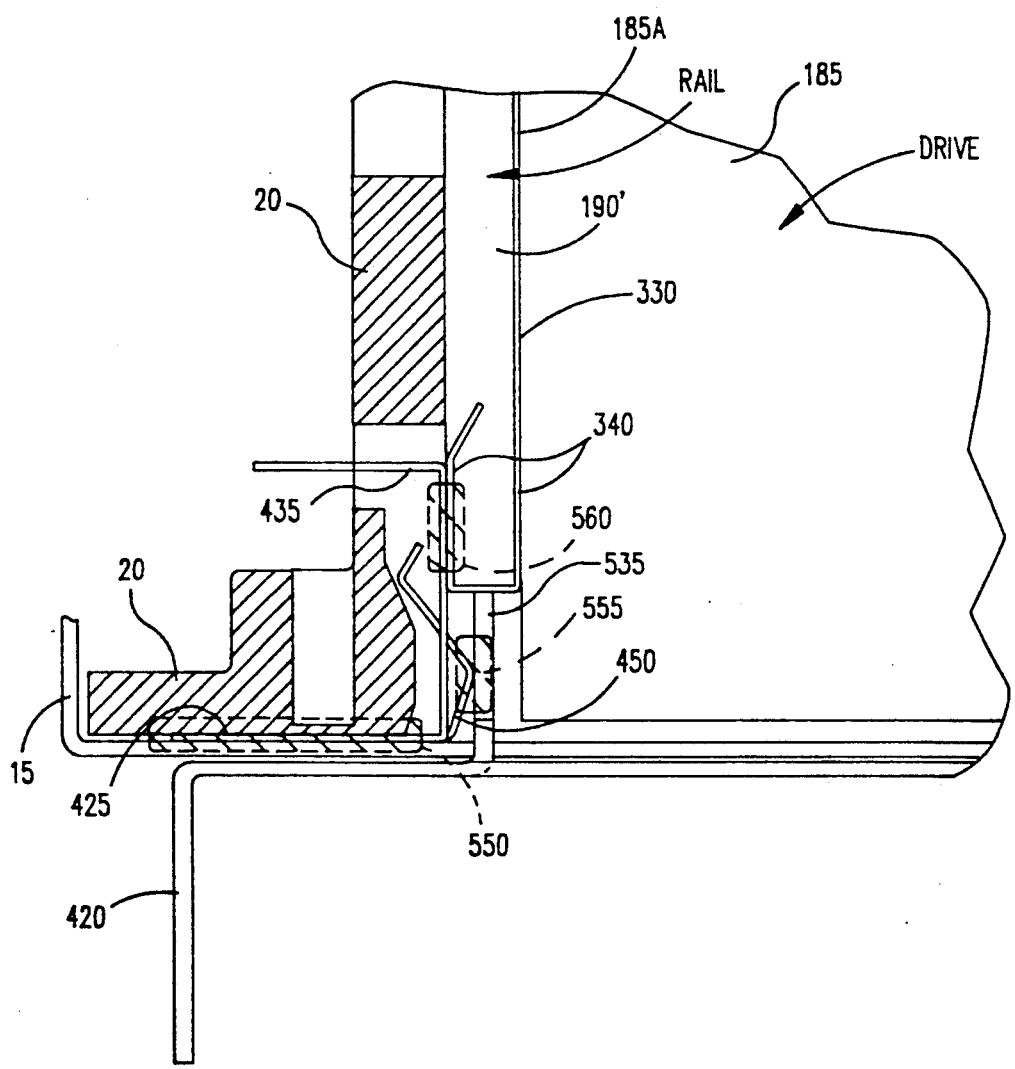
FIG. 16 is a bottom cross sectional view of the ground strip installed between the housing and drive support structure, such cross section being taken along section line E—E of FIG. 7 and showing the ground strip and surrounding components.

As shown partially in the cross sectional view of drive 185 and adjacent structures in FIG. 16, another ground spring 330/rail 190' assembly substantially symmetrical with respect to the ground spring 330/rail 190 assembly is installed on the remaining opposed side surface 185A in a manner similar to that described above. This cross sectional view of FIG. 16 is taken along section line E—E of FIG. 7 and additionally shows a portion of drive retainer 420. An electro-magnetic interference (EMI)/radio frequency interference (RFI) shielding spring structure 425 is situated between case 15 and drive support structure 20 and further contacts both conductive retainer 420 and wrap around portion 340. In this manner, drive 185 is coupled to grounded case 15 and retainer 420 is coupled to grounded case 15. The nature of this grounding arrangement is now discussed in more detail.

Figure 17:
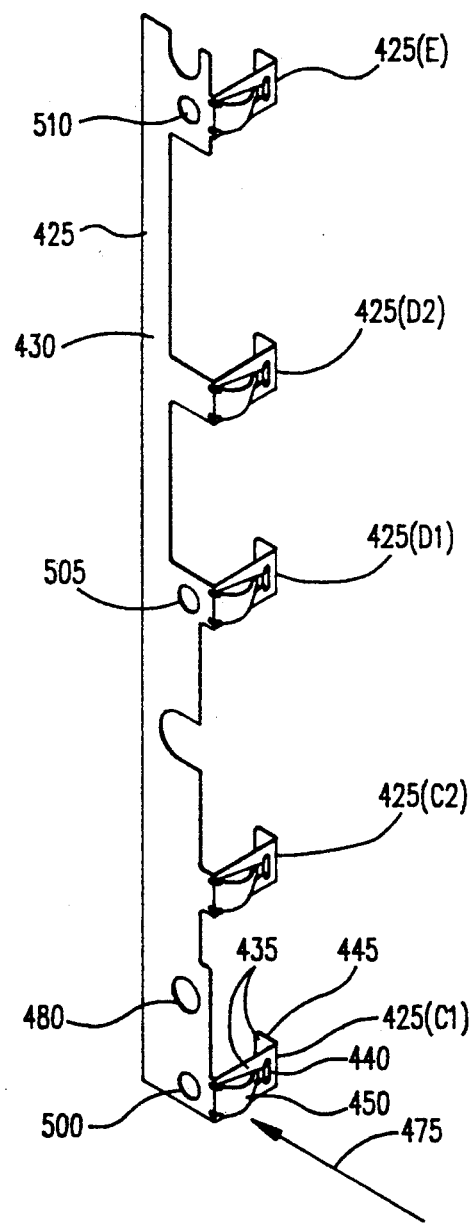
FIG. 17 is a front perspective view of the ground strip of FIG. 16.

FIG. 17 is a right side perspective view of shielding spring structure 425 which is fabricated from a flat strip 430 of electrically conductive material. A plurality of dual spring structures designated 425(C1), 425(C2), 425(D1), 425(D2) and 425(E) extend from one side of strip 430. The alpha-numeric designation appearing in parentheses in each of the preceding spring structure designations denotes the corresponding drive bay into which the spring structure is located as will be discussed later in more detail. Shielding spring structure 425 is fabricated from the same types of electrically conductive material as grounding spring 330 described earlier. Dual spring structures 425(C1), 425(C2), 425(D1), 425(D2) and 425(E) are substantially identical and thus only dual spring structure 425(C1) will be discussed now for purposes of example.

Dual spring structure 425(C1) includes a first spring member 435 having a contact plate 440 which integrally extends from spring strip 430. Prior to installation of spring structure 425 in case 15 and prior to loading of spring structure 425, contact plate 440 is oriented at an angle of approximately 95 degrees with respect to spring strip 430. At the end of contact plate 440 most distant from spring strip 430, spring structure 425(C1) is bent at an angle of approximately 90 degrees back toward spring strip 430 as shown in FIG. 17 to form a flange 445 which is oriented substantially parallel to spring strip 430.

Figure 18:
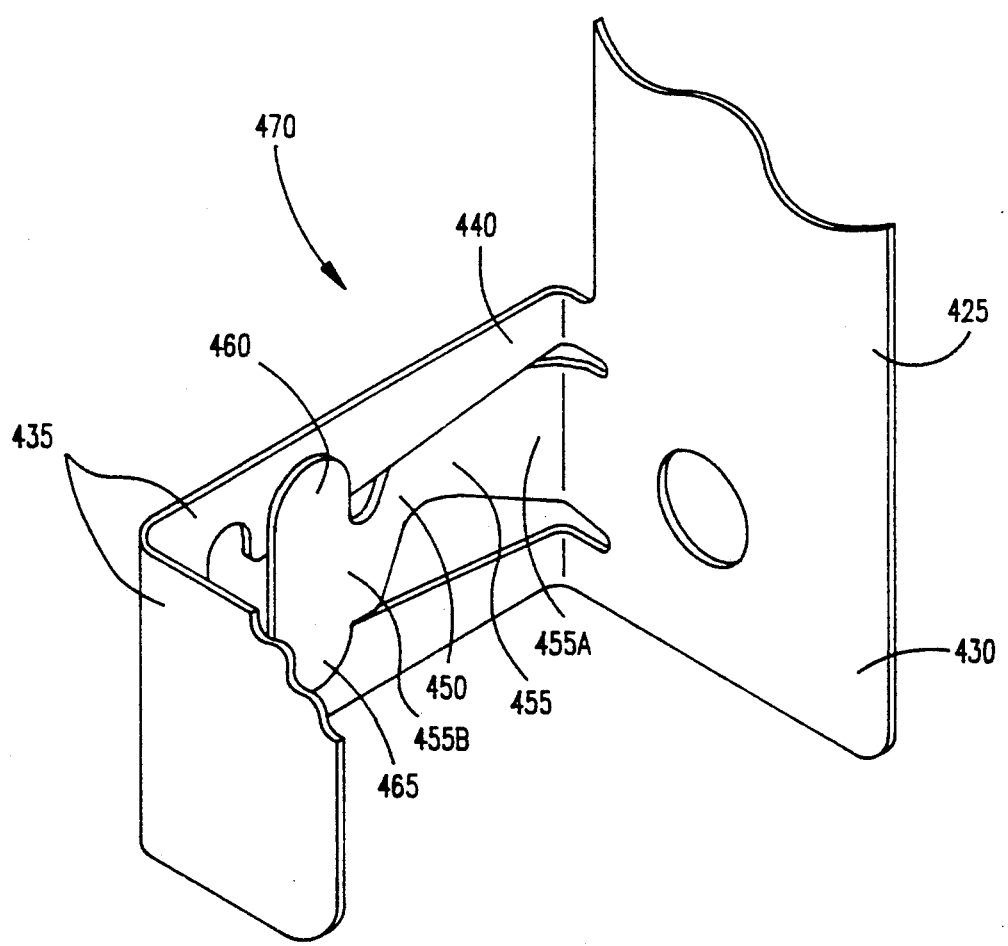
FIG. 18 is a rear perspective view of the ground strip of FIG. 16.

A second spring member 450 is punched out of the portion of first spring member 435 which forms contact plate 440 as seen in FIG. 17 and as seen more clearly in the left side perspective view of spring shielding structure 425 shown in FIG. 18. Second spring member 450 includes a central spring arm 455 which extends from spring strip 430 as seen in FIG. 18. Spring arm 455 includes opposed ends 455A and 455B of which ends 455A joins spring strip 430. A pair of wing members 460 and 465 extend away from spring arm end 455B as illustrated in FIG. 18. Wing members 460 and 465 may contact plate 440 which acts as a stop against further travel of wing members 460/465 toward plate 440. Second spring member 455 deflects in the direction indicated by arrow 470 in FIG. 18 and arrow 475 in FIG. 17 when placed in contact with retainer 420 of FIG. 16 as discussed later.

Shielding spring structure 425 is installed in position on drive support structure 20 as indicated in FIG. 1A with each of dual spring structures 425(C1), 425(C2), 425(D1), 425(D2) and 425(E) being inserted into a corresponding one of bays C1, C2, D1, D2 and E, respectively. Spring strip 430 of FIG. 17 includes a guide hole 480 through which a guide post 485 of FIG. 2 extends when spring strip 430 is mounted on drive support structure 20. Drive support structure 20 further includes guide posts 490 and 495 which are substantially similar to guide post 485. Returning again to FIG. 17, it is seen that spring strip 430 of shielding spring structure 425 further includes holes 500, 505 and 510 which are aligned with corresponding holes in drive support structure 20 when shielding spring structure 425 is mounted thereon. Screws (not shown) are screwed through these shielding spring holes 500, 505 and 510 and into the corresponding holes in drive support structure 20 to hold shielding spring structure 425 to drive support structure 20.

Figure 19A:
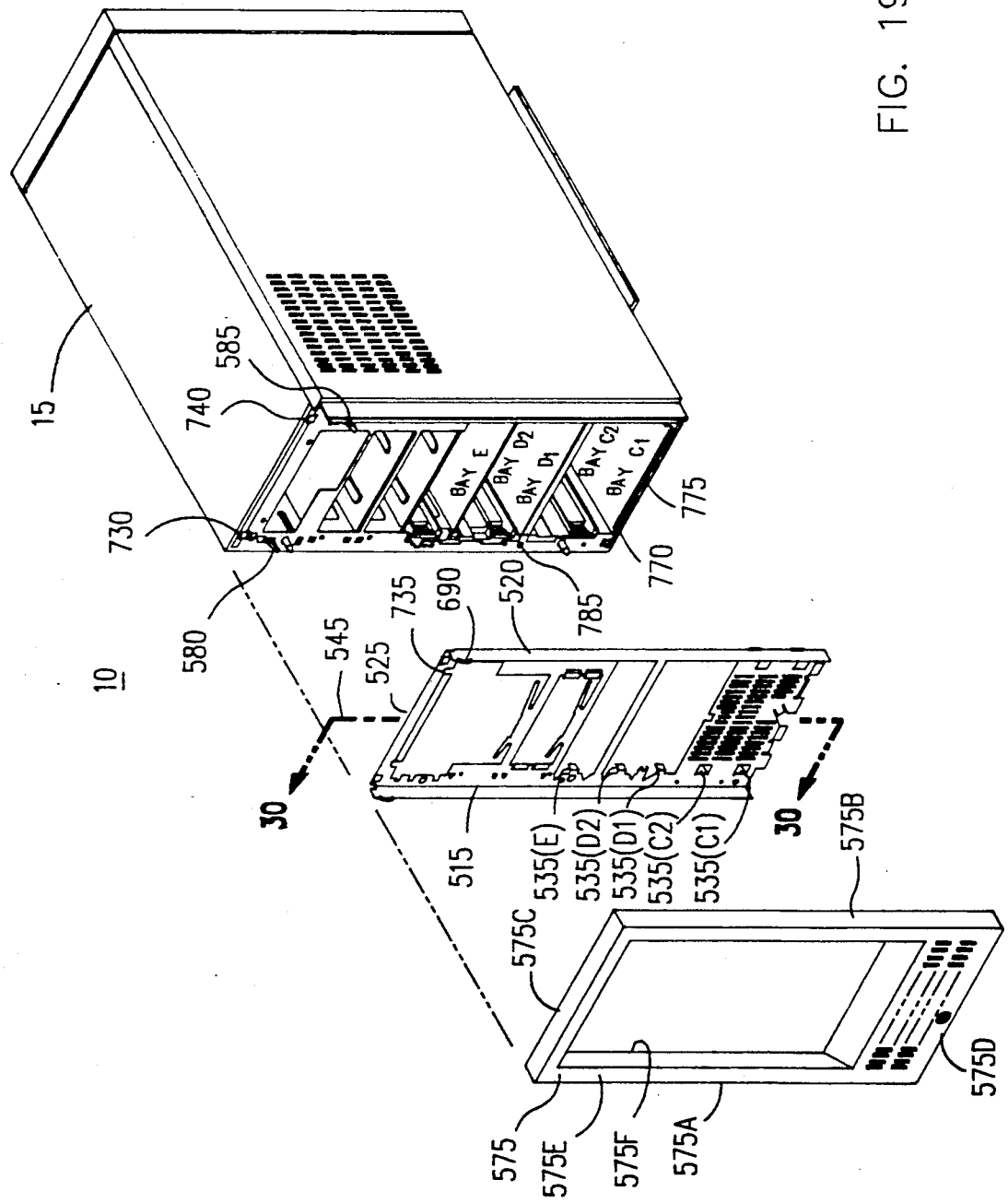
FIG. 19A is a front right side exploded perspective view showing the housing/drive support structure, the retainer and bezel.

Before completing the discussion of spring shield 425, it is helpful to discuss drive retainer 420 which aids in holding any drives in place which are installed in bays C, D and E. Referring now to FIG. 19A, disk drive retainer 420 is shown in more detail. Retainer 420 is fabricated from electrically conductive material and is generally rectangularly framelike in appearance. Retainer 420 includes substantially parallel side support members 515 and 520 which are joined at their respective tops by a connecting member 525. Support members 515 and 520 are joined at their respective bottom portions by a connecting member 530 which is appropriately dimensioned to cover drive C.

Retainer 420 includes contact tabs 535(C1), 535(C2), 535(D1), 535(D1) and 535(E) which respectively contact second spring members 450 of spring structures 425(C1), 425(C2), 425(D1), 425(D1) and 425(E) of FIG. 17 when spring shield 425 and retainer 420 are installed on drive support structure 20. Although not visible in the view of retainer 420 shown in FIG. 19A, contact tabs 540(C1), 540(C2), 540(D1), 540(D1) and 540(E) are situated on side support member 520 in symmetrical fashion about axis 545 with respect to contact tabs 535(C1), 535(C2), 535(D1), 535(D1) and 535(E) which are shown on side support member 515. Contact tabs 540(C1), 540(C2), 540(D1), 540(D1) and 540(E) are shown in the right side perspective view of retainer 420 of FIG. 19B.

The electrical connections achieved by shielding spring 425 are now discussed with reference to FIG. 16 which depicts a full height drive 185 installed in a bay in drive support structure 20. Shielding spring 425 connects case 15 to both drive retainer 420 and full height drive 185. The arrangement shown in FIG. 16 results in three electrical contact zones 550, 555 and 560. More specifically, since spring strip 425 of shield spring 420 is sandwiched between drive support structure 20 and housing 15, housing 15 is thus connected to shield spring 425 at contact zone 550. Since connecting tab 535 of retainer 420 is electrically connected to second spring member 450 of shield spring 425 at contact zone 555, retainer 420 is thus grounded to case 15. Moreover, since wrap-around portion 340 of grounding spring 330 is connected to first spring member 435 at contact zone 560, drive 185 is thus grounded to case 15.

Figure 20:
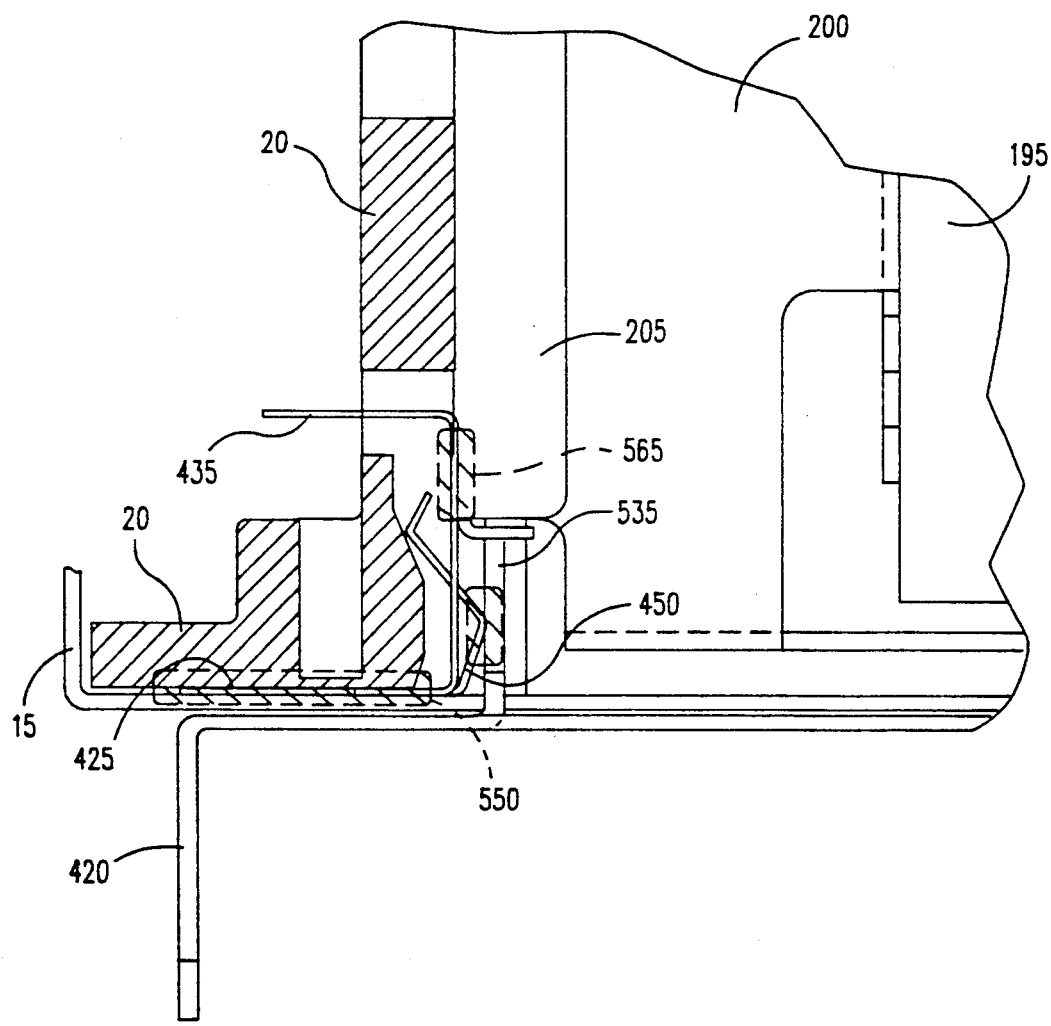
FIG. 20 is the bottom cross sectional view showing the ground strip of FIG. 16 and surrounding components including an adapter tray mounted drive.

Alternatively, as shown in FIG. 20, a drive 195 mounted in adapter tray 200 with integral conductive side rails 200/205 is installed in drive support structure 20 in place of the drive 185 discussed above. In this instance, the electrical grounding connections are made as follows. Retainer 420 is connected to housing 15 via contact zones 550 and 555 in the same manner as in FIG. 16 discussed above. However, conductive integral side rail 205 of adapter tray 200 is connected to first spring member 435 at contact zone 565. Thus, adapter tray 200 and drive 195 therein are grounded to case 15.

Figure 21:
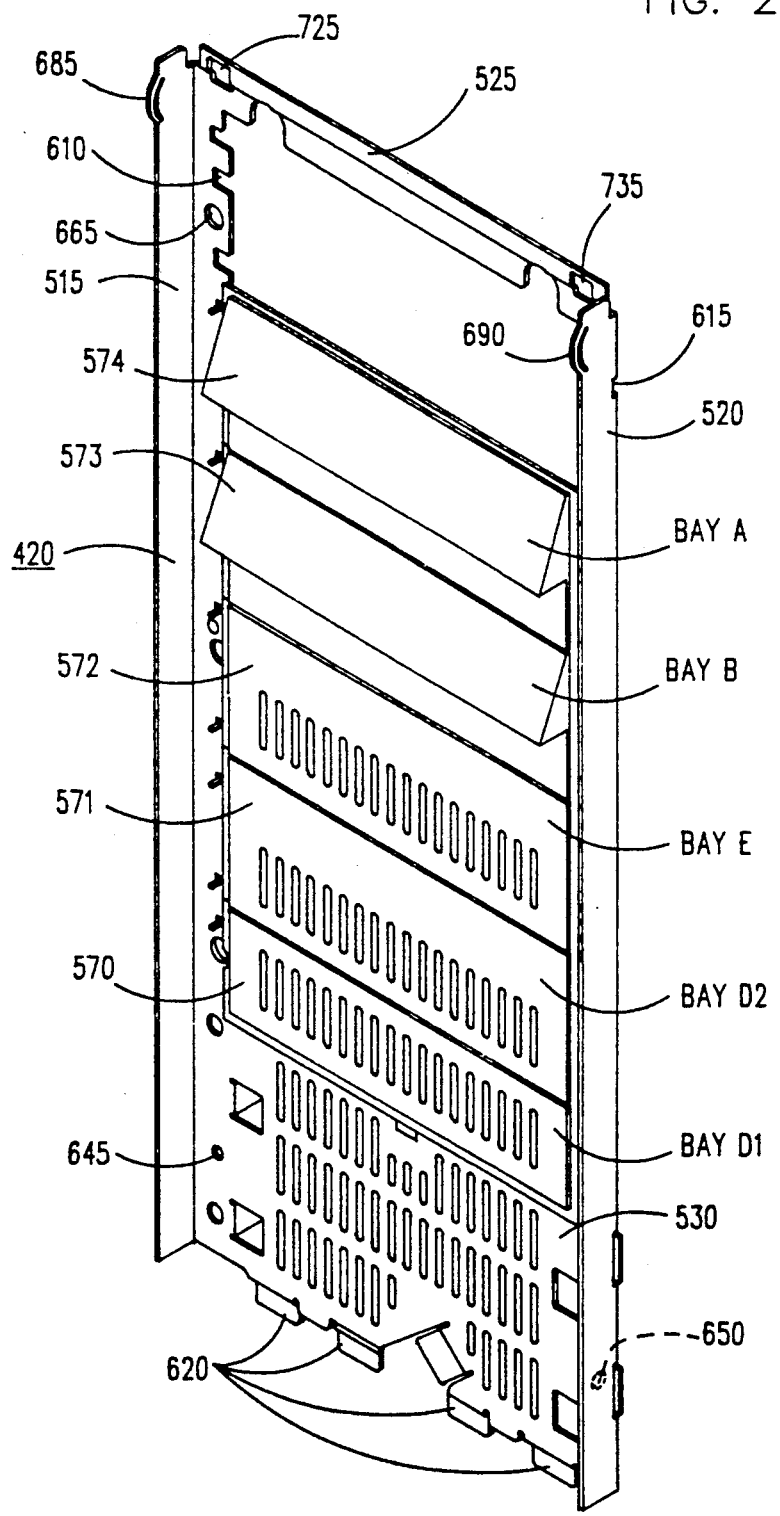
FIG. 21 is a front right side perspective view of the retainer.

As seen in FIG. 21, to further enhance shielding in personal computer assembly 10, electrically conductive bezels 570, 571, 572, 573 and 574 are mounted in retainer 420 respectively at bays D1, D2, E, B and A, respectively, if no drives are contained therein. By employing the grounding and shielding structures described above with reference mainly to FIGS. 16-21, both EMI and RFI emanations radiating from within case 15 are significantly reduced.

Before discussing the manner in which retainer 420 and bezel 575 of FIG. 19A cooperate to hold respective drives in bays C1, C2, D1, D2 and E, it is helpful to discuss drive support structure 20 and retainer 420 further. Referring to FIG. 2, it seen that drive support structure 20 includes snap members 580 and 585. Snap members 580 and 585 are used to initially hold retainer 420 to housing 15 before bezel 575 is attached to and mounted on retainer 420/housing 15 as will be discussed later in more detail.

To more clearly show the shape of snap members 580 and 585 a cross sectional view of a portion of drive support structure 20 of FIG. 2 taken along section line B—B is shown in FIG. 22. Snap member 585 is thus depicted in FIG. 22. A portion of housing 15 is shown adjacent drive support structure 20 in FIG. 22. Snap member 585 is substantially J-shaped and includes an end 585A which is integrally attached to drive support structure 20 as shown. Snap member 585 further includes an end 585B which extends through an opening 590 in drive support 20 and housing 15. Drive support structure 20 includes a similar opening 595 adjacent snap member 580 as shown in FIG. 2. Returning again to FIG. 22, it is seen that snap member 585 includes a ramp-like guide 600 which deflects downward about curved portion 585C when member 580 engages retainer 420. A recessed portion or catch 605 is located at the upper end of ramp 600, the operation of which will be discussed later in more detail. Snap member 580 is substantially similar to snap member 585.

Referring now to FIG. 21 and as shown more clearly in FIG. 19B, retainer 420 includes holes, openings or slots 610 and 615 in side members 515 and 520 which are aligned with corresponding holes 595 and 590, respectively, in drive support structure 420 when retainer 420 is installed on case 15 and drive support structure 20.

The installation of retainer 420 on case 15/drive support structure 20 is now discussed. FIG. 23 shows a cross section of housing 15/drive support structure 20 of FIG. 1B taken along section line A—A together with a corresponding cross section of retainer 420. Referring now to inset view 23A, which is a magnified view of the lower portion of retainer 420 that is first installed in the base of housing 15, it is seen that the lowermost portion of retainer connecting member 530 includes a plurality of tabs 620, one of which is shown in FIG. 23 inset 23A. Four of such tabs 620 are shown in the perspective view of retainer 420 in FIG. 21.

To install retainer 420, tabs 620 of retainer 420 are placed above and adjacent a lip member 625 in the base of case 15 as seen in FIG. 23 inset 23A. Lip member 625 is also shown in the view of enclosure 15 shown in FIG. 1B. Retainer 420 is then lifted slightly upward in the direction of arrow 630 and is rotated in the direction of arrow 635 about the pivot point 640 formed where tabs 620 contact member 625 of housing 15. Retainer 420 is rotated in the direction of arrow 635 until retainer 420 comes into contact with guide posts 485 and 490 as indicated in the cross sectional view of FIG. 24 and inset 24. Guide posts 485 and 490 are seen more clearly in the perspective view of drive support structure 20 of FIG. 2. As indicated in FIG. 24, guide posts 485 and 490 extend beyond housing 15 through respective holes (not shown in detail) in housing 15 toward retainer 420. Guide post 485 includes a tapered end 485A as seen in FIG. 24 which is now discussed. Guide post 490 similarly includes a such a tapered end.

FIG. 24 is the same cross sectional view as FIG. 23 except that further progress in the rotation of retainer 420 is shown in FIG. 24 and inset views 24A and 24B. As seen in FIG. 21, retainer 420 includes holes 645 and 650 (shown in dashed lines) for engaging guide posts 485 and 490, respectively. Returning again to FIG. 24, as rotation of retainer 420 continues such that hole 645 engages the tapered end 485A of guide post 485 as indicated in inset view 24B, hole 645 rides up on the tapered end 485A to lift retainer 420 up in the direction of arrow 655. The same dynamics occur as retainer hole 650 engages guide post 490. Retainer 420 is thus appropriately positioned and aligned on housing 15.

Figure 25A:
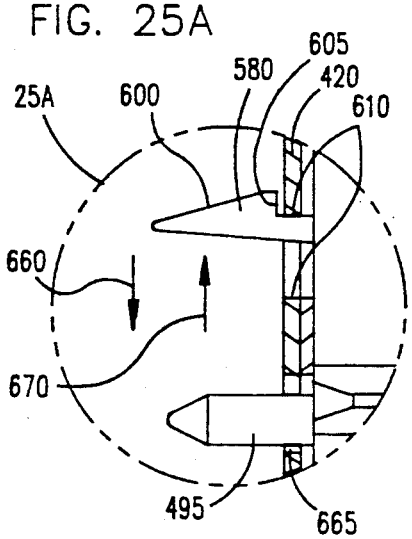
FIG. 25 is a side cross sectional view of the computer housing/drive support assembly showing the final stage of installation of the retainer on the assembly wherein installation in complete.
Figure 25B:
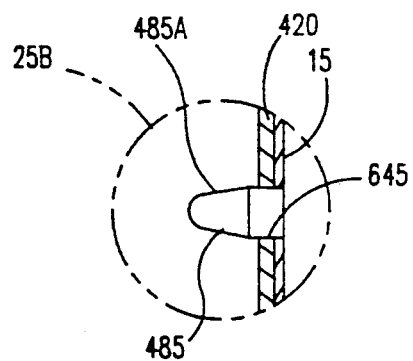
Figure 25C:
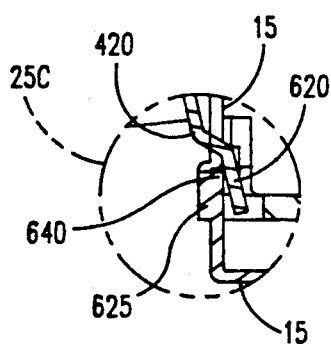
Figure 25:
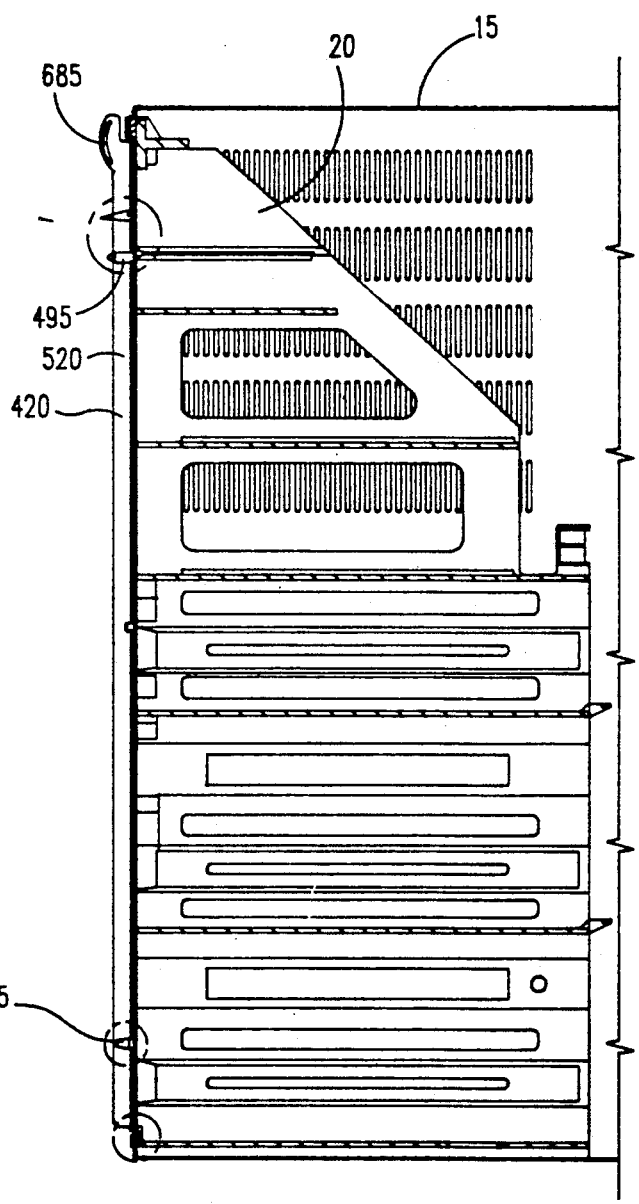

After retainer 420 engages guide posts 485 and 490 in the above described manner, rotation of retainer 420 in the direction indicated by arrow 635 of FIG. 24 is continued until retainer 420 completely mates with housing 15/drive support structure 20 as shown in FIG. 25. FIG. 25 is the same cross sectional view as FIG. 24 except that completion of progress in the rotation of retainer 420 is shown in FIG. 25 and inset views 25A, 25B and 25C thereof.

As seen in FIG. 25, the upper portion of the case 15/drive support structure 20 assembly includes a guide post 495 which is shown in more detail in inset view 25A and which was shown earlier in FIG. 2. When the pivotal rotation of retainer 420 toward the housing 15/drive support structure 20 assembly is nearly complete, guide post 495 passes through a hole or opening 665 (also see FIG. 21) in the upper portion of retainer 420.

Similarly, as seen in FIG. 25 inset view 25B, when retainer 420 is fully installed on the housing 15/support structure 20 assembly, retainer opening 645 has fully engaged guide post 485. Guidepost 490 (see FIG. 2) is similarly engaged by retainer opening 650 (not shown in FIG. 25, but shown in dashed lines in FIG. 21 and shown in more detail in FIG. 19B. In this manner, the alignment of retainer 420 on the housing 15/support structure 20 assembly is completed.

FIG. 25 inset 25C shows the orientation of tabs 620 of retainer 420 with respect to lip member 625 of housing 15 when installation of retainer 420 is complete.

As seen in FIG. 25, taken in conjunction With FIG. 22, when the rotation of the upper portion of retainer 420 toward the housing 15/support structure 20 assembly is nearly complete, retainer opening 610 engages ramp 600 of snap member 580 causing ramp 600 to be deflected downward in the direction of arrow 660. As rotation of retainer 420 continues, opening 610 passes over ramp 600 and snap member 580 pops back up or snaps back up in the direction of arrow 670. When this occurs, latch 605 becomes latched to retainer 420 adjacent opening 610. It is noted that snap member 580 is substantially similar to snap member 585 shown in FIG. 22 and that like numbers are used to indicate identical components of snap members 580 and 585. Both of snap members 580 and 585 act as "living snaps" in that once opening 610 passes by latch 605, snap member 580 snaps back to its original undeflected position of its own accord. Snap member 585 shown in FIG. 2 operates in a manner substantially similar to that described above to engage a respective retainer opening 615 which is partially visible in FIG. 21 and which is shown in more detail in FIG. 19B.

When installation of retainer 420 is complete on the housing 15/support structure 20 assembly, the disk drives which are installed in bays C1, C2, D1, D2 and E are held fixedly in position in these bays by retainer contact tabs 535(C1), 535(C2), 535(D1), 535(D1) and 535(E) which act as respective stops against movement by the respective drives at the left sides thereof. Reference is now made to FIG. 16 to illustrate how one of such tabs 535 contacts wrap-around portion 340 of grounding spring 330 to prevent forward motion of rail 190' and drive 185 attached thereto. In addition to the stopping action provided by retainer contact tabs 535(C1), 535(C2), 535(D1), 535(D1) and 535(E) described above, retainer contact tabs 540(C1), 540(C2), 540(D1), 540(D1) and 540(E) (shown in detail in FIG. 19B) provide a similar stopping action to the right side of the drives in bays C1, C2, D1, D2 and E as seen in FIG. 15.

The arrangement for grounding the right side of retainer 420 to case 15 is now discussed. As seen in FIG. 1A, housing 15 includes a flange 675 which extends from top member 15C to bottom member 15D at the rightmost portion of housing 15. An electrically conductive grounding strip 680 is situated on flange 675. Grounding strip 680 is coextensive with flange 675 and is formed such that when retainer 420 is installed on the housing 15/drive support structure 20 assembly, the right side of retainer 420 is electrically coupled to housing 15 via conductive grounding strip 680. The structure and operation of grounding strip 680 is discussed in more detail in the copending patent application entitled "Self Contained Grounding Strip", by Cooke et al., filed (filing date to be assigned), Ser. No. (to be assigned), assigned to the instant assignee, such application being incorporated herein by reference.

It is noted that prior to installation of bezel 575 on retainer 420, a significant amount of force is exerted outwardly on catches 605 of snap members 580 and 585 by the drives installed in bays C, D and E while retainer 420 holds such drives in their respective bays. The installation of bezel 575 on the assembly formed by retainer 420, housing 15 and drive support structure 20 relieves this force and tension. Reference is now made to the front perspective view of bezel 575 is shown in FIG. 19A. Bezel 575 includes side members 575A and 575B, top and bottom members 575C and 575D, and front and back surfaces 575E and 575F, respectively.

Figure 26:
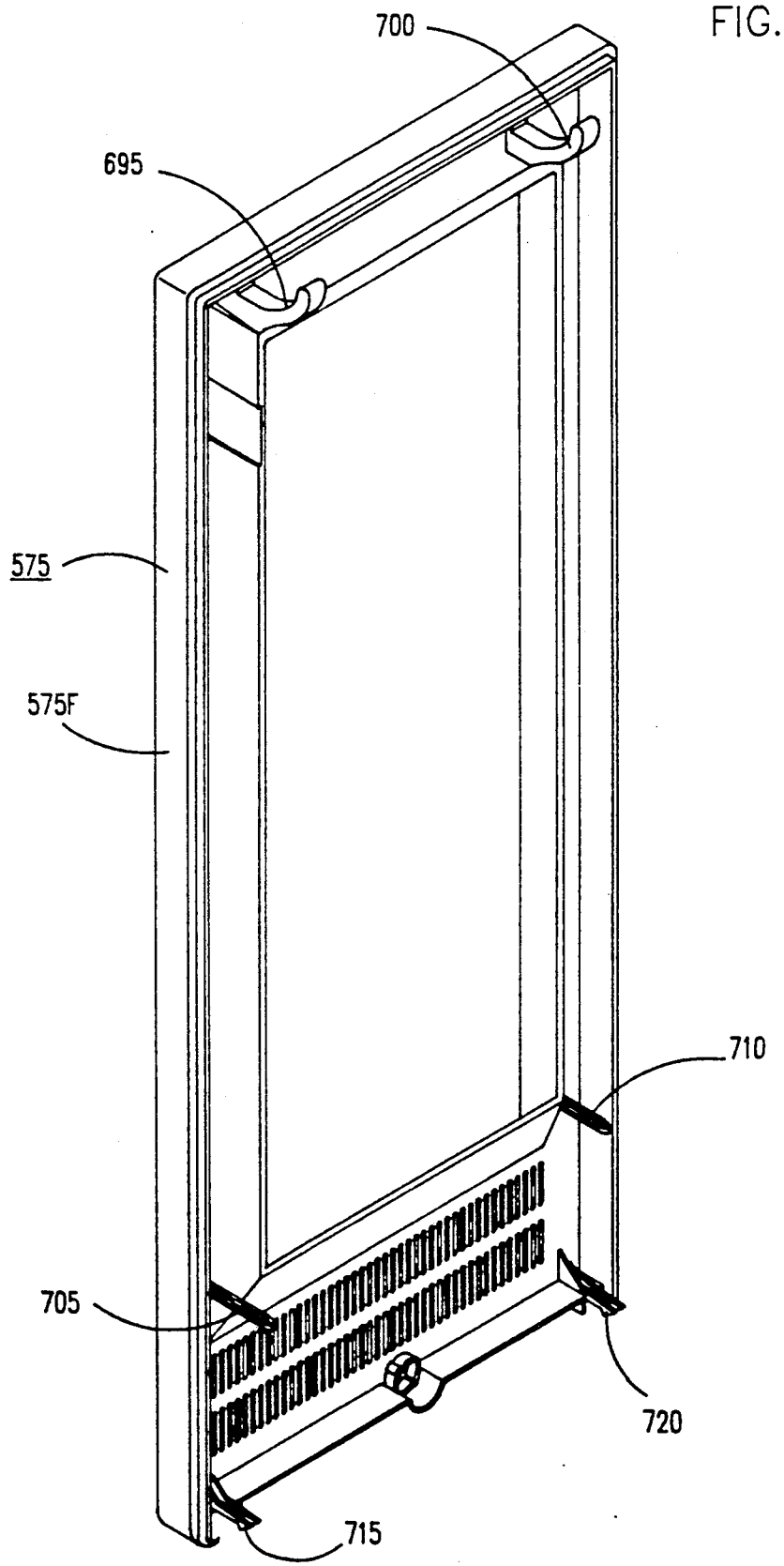
FIG. 26 is a rear perspective view of the bezel for the retainer.

A rear perspective view of bezel 575 is shown in FIG. 26. Bezel 575 includes projections 695 and 700 extending from the uppermost portion of the rear of bezel 575. Bezel 575 further includes guide posts 705 and 710. Bezel 575 also includes resilient snap members 715 and 720 extending from the rear thereof.

Figure 27:
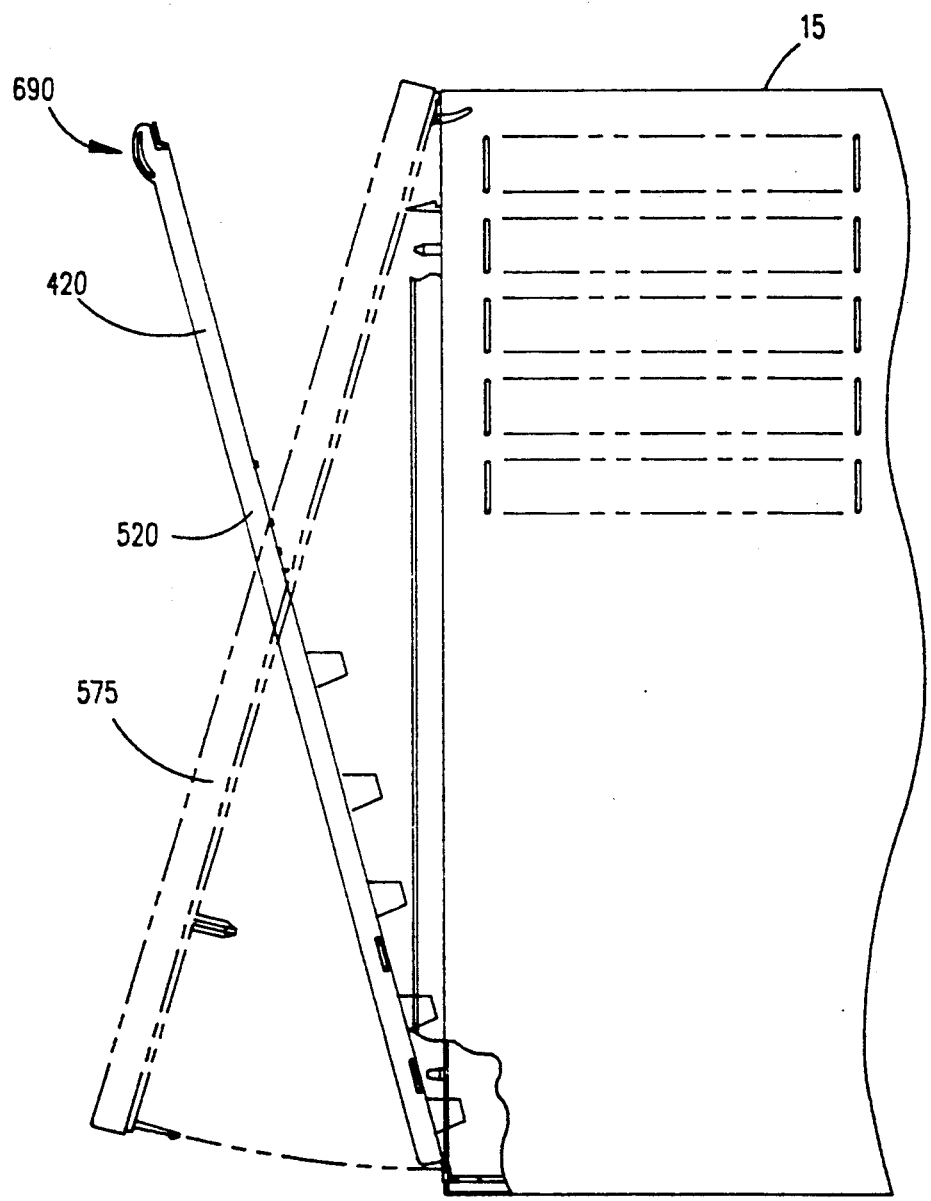
FIG. 27 is a side view of the computer housing showing the retainer and bezel prior to installation on the housing.

FIG. 27 is a side view of housing 25/drive support structure 20 which shows the initial positioning of retainer 420 prior to installation and which further shows the positioning of bezel 575 prior to installation. It is noted that retainer 420 pivots about the bottom of housing 15 whereas bezel 575 pivots about the top of housing 15. However, retainer 420 is installed prior to the installation of bezel 575.

Figure 28:
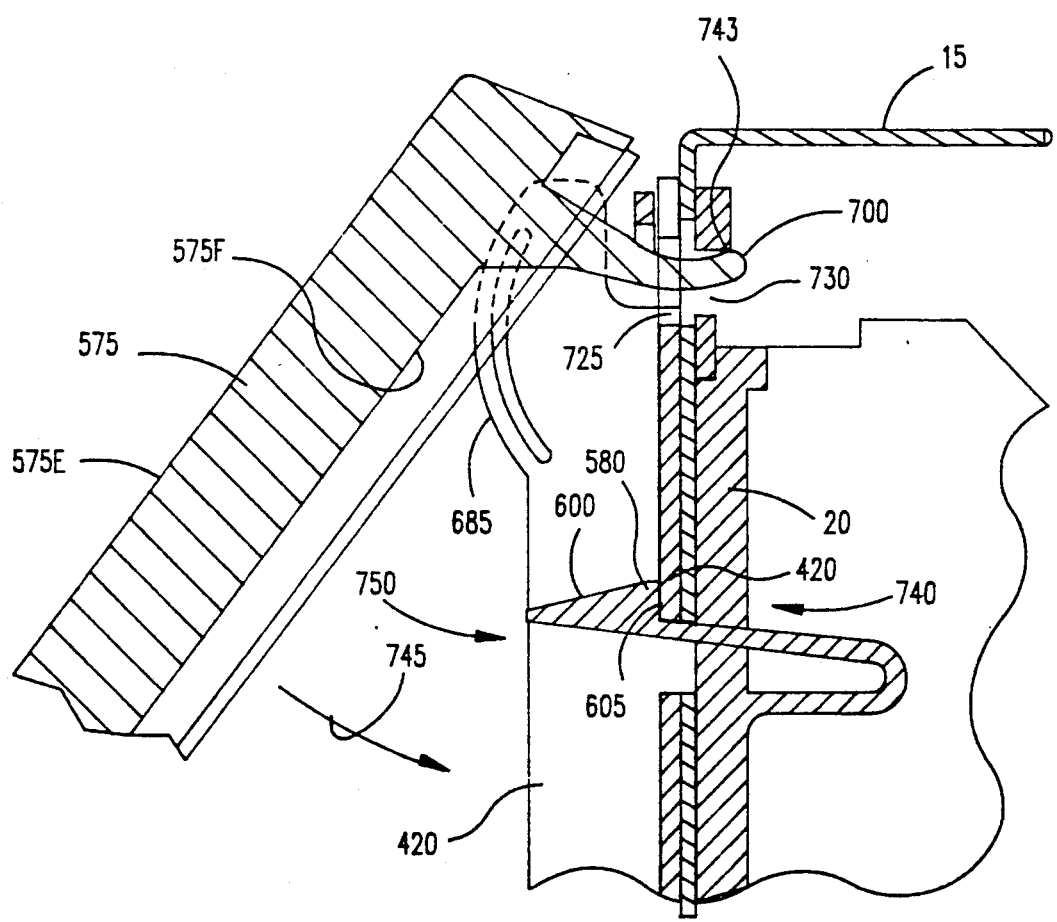
FIG. 28 is a side cross sectional view showing the upper portion of the bezel during installation on the computer housing.

As seen in FIG. 19A and partially in FIGS. 25 and 27, retainer 420 includes cams or rounded raised regions 685 and 690 on the upper portions of side members 515 and 520, respectively. FIG. 28 shows a cross sectional side view of a portion of bezel 575, retainer 420 and housing 15 taken along section line C—C of FIG. 19A. FIG. 28 will be used to illustrate the initial stage of installation of bezel 575 on retainer 420. First, projection 700 is inserted in an opening 725 of retainer 420 and through an opening 730 of housing 15, such openings 725 and 730 being shown in perspective in FIG. 19A. FIG. 19A also shows retainer opening 735 and housing opening 740 which by receiving projection 695 of bezel 575 perform a similar function to openings 725 and 730, respectively. At this stage in the installation of bezel 575, outward force is still being exerted on latch 605 of snap member 580 in the direction of arrow 740 in FIG. 28. Bezel 575 has not yet relieved that pressure or force as indicated by latch 605 of snap member 580 still being in contact with retainer 420.

Figure 29:
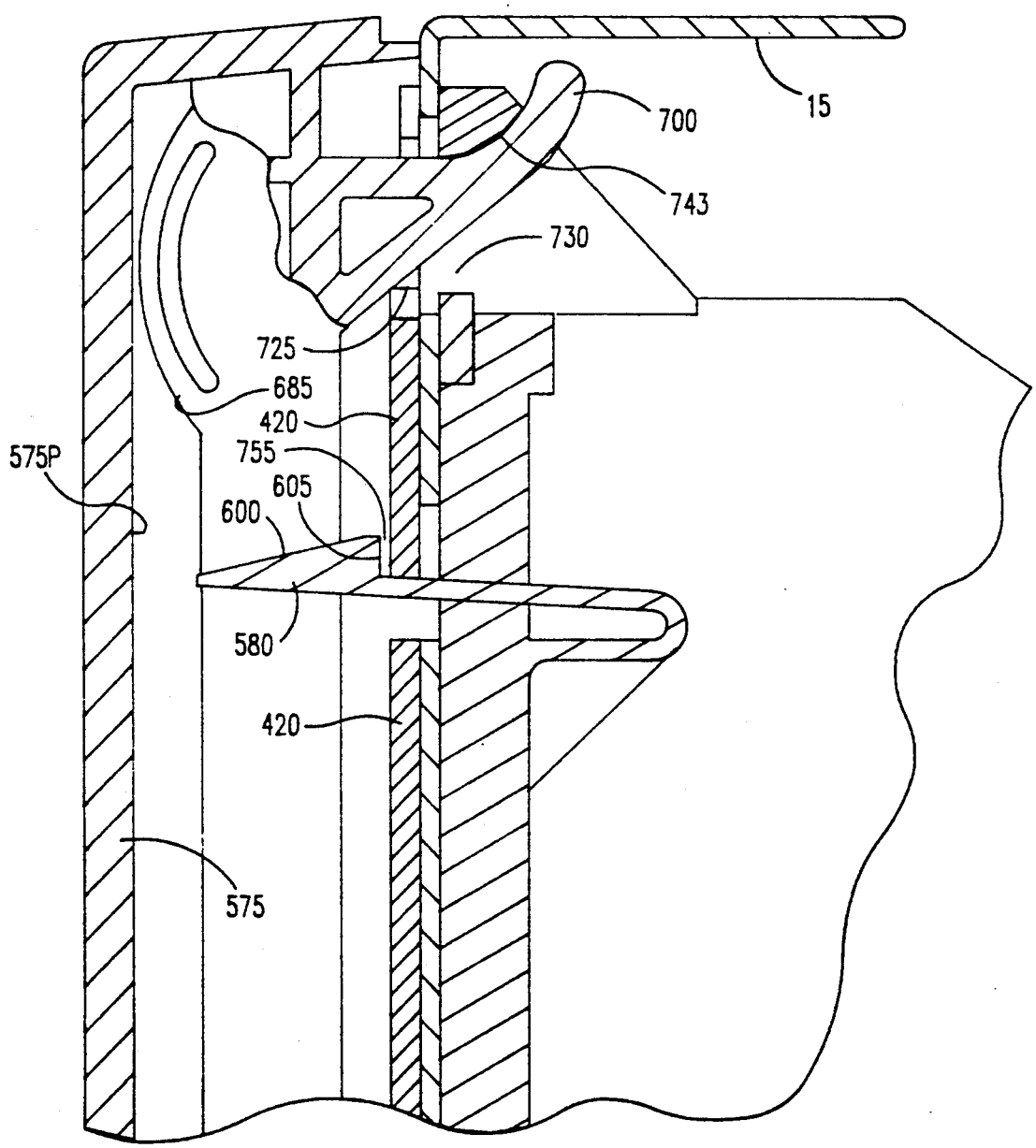
FIG. 29 is a side cross sectional view showing the upper portion of the bezel after installation on the computer housing is complete.

Bezel 575 is now rotated about a pivot point 743 in the direction of arrow 745 toward retainer 420 until rear surface 575F of bezel 575 engages cam 685. As the rotation of bezel 575 is continued, rear bezel surface 575F continues to engage cam 685 so as to push retainer 420 inward in the direction of arrow 750 toward housing 15. As the rotation of bezel 575 is continued until rear bezel surface 575F fully engages cam 685 as shown in FIG. 29, this action causes retainer 420 to be pushed away from latch 605 as indicated by the space 755 between latch 605 and retainer 420. In this manner, the force which was earlier placed on latch 600 by retainer 420 is relieved.

Figure 30:
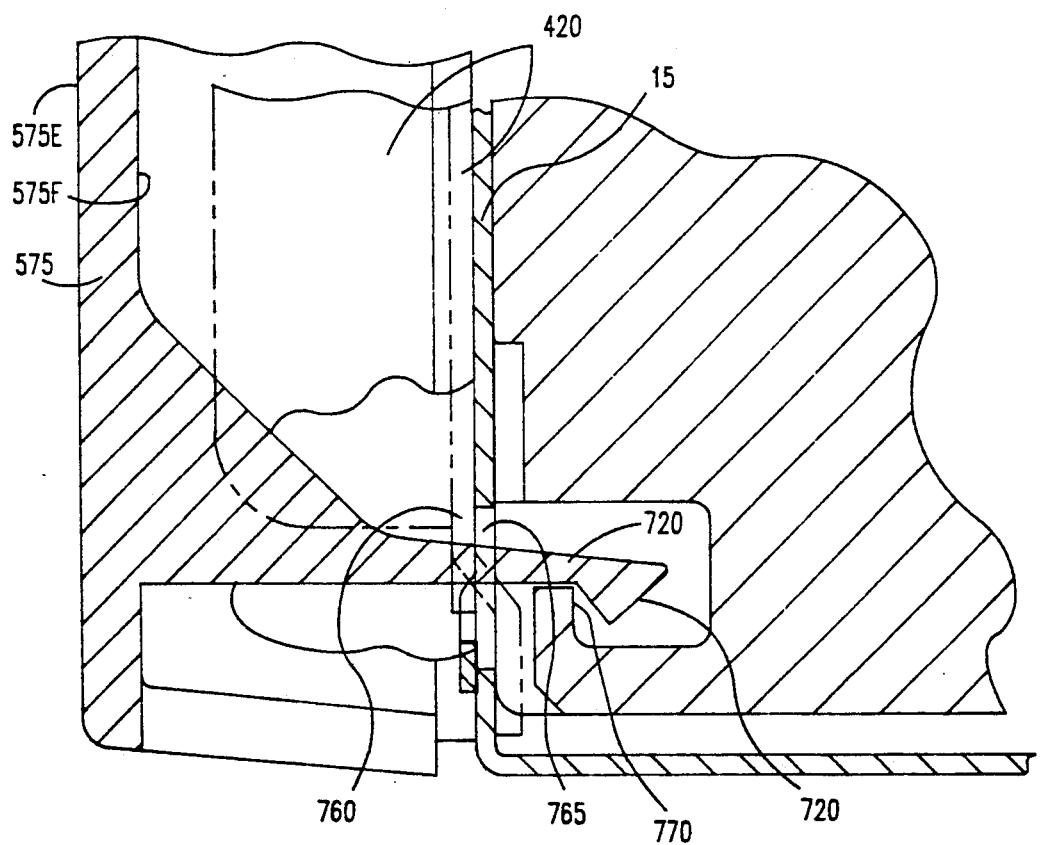
FIG. 30 is a side cross sectional view showing the lower portion of the bezel after installation on the computer housing is complete.

FIG. 30 is a cross sectional view of the lowermost portion of the bezel 575/retainer 420/housing 15/support structure 20 assembly of FIG. 19A along section line C—C. As seen in FIG. 30, when bezel 575 is fully rotated into position on retainer 420 as described above, snap member 720 passes through an opening 760 in retainer 420 and through an opening 765 in housing 15 so as to latch with a lip 770 adjacent the bottom of housing 15. The location of lip 770 is shown in FIG. 19A. Similarly, snap member 715 latches to a corresponding lip 775 (shown in FIG. 19A) after passing through corresponding openings in retainer 420 and housing 15 (not shown) which are adjacent to snap member 715 when bezel 575 is fully installed.

As bezel 575 is rotated and installed on retainer 420 as described above, guide post 710 (shown in FIG. 26) passes through opening 780 in retainer 420 (shown in FIG. 19A) and though opening 785 in housing 15 (also shown in FIG. 19A). Guide post 705 passes through similar openings in retainer 420 and housing 15. Guide posts 705 and 710 aid in the alignment of bezel 575 while bezel 575 is rotated and installed on retainer 420 as described above.

The foregoing describes a drive mounting structure which is fabricated from non-conductive or non-metallic materials and which contributes significantly to the structural integrity of the computer housing in which it is situated. Moreover, a computer housing structure is provided in which drives and other devices are removable from the computer with a minimum of user effort.

While only certain preferred features of the invention have been shown by way of illustration, many modifications and changes will occur to those skilled in the art. It is, therefore, to be understood that the present claims are intended to cover all such modifications and changes which fall within the true spirit of the invention.

We claim:

1. A personal computer enclosure comprising:
   a substantially parallelepiped outer box including an interior defined by a front member, a back member that opposes and is substantially parallel with respect to said front member, a top member, a bottom member and a side member that are all substantially perpendicular with respect to said front member, and an open side, opposing said side member, for receiving an inner support structure, wherein said front member includes an opening for providing access to the interior of said box, said box including a plurality of means for mounting the inner support structure on the interior of said box onto said front member and at least one of the members that is substantially perpendicular with respect to said front member; and
   an inner support structure situated within said outer box and including a plurality of bays for receiving respective disk drives therein, the bays of said structure communicating with said opening, said structure being attached to said outer box via said means for mounting onto said front member and at least one of the members that is substantially perpendicular with respect to said front member to provide structural integrity thereto.

2. The computer enclosure of claim 1 wherein said outer box is fabricated from electrically conductive material and said inner support structure is fabricated from electrically insulative material.

3. The computer enclosure of claim 1 wherein said inner support structure extends along a substantial portion of said opening.

4. The computer enclosure of claim 1 wherein said outer box is metal and said inner support structure is non-metallic.

5. A computer enclosure for housing and supporting computer system components, comprising:
   (a) a substantially parallelepiped outer box including an interior defined by a front member, a back member that opposes and is substantially parallel with respect to said front member, a top member, a bottom member and a side member that are all substantially perpendicular with respect to said front member, and an open side, opposing said side member, for receiving an inner support structure, wherein said front member includes an opening for providing access to the interior of said box, said box including a plurality of means for mounting the inner support structure on the interior of said box onto said front member and at least one of the members that is substantially perpendicular with respect to said front member; and
   (b) an inner support structure situated within said outer box, for receiving and supporting said components therein, said structure communicating with said opening and being attached to said outer box via said means for mounting onto said front member and at least one of the members that is substantially perpendicular with respect to said front member to provide structural integrity thereto.

6. A computer enclosure for housing and supporting computer system components, comprising:
   (a) a case having an open chamber, defined by a front member, a back member that opposes and is substantially parallel with respect to said front member, a top member, a bottom member and a side member that are all substantially perpendicular with respect to said front member, and an open side, opposing said side member, for receiving an inner support structure, wherein said open chamber is suitable for receiving and housing said components and a component support structure;

(b) a substantially rigid component support structure suitable for being anchored within said case; and (c) means for anchoring said support structure within said case, onto said front member and at least one of the members that is substantially perpendicular with respect to said front member, to enhance the structural integrity of the case.

7. Apparatus as set forth in claim 6 wherein said case is fabricated from electrically conductive material.

8. Apparatus as set forth in claim 6 wherein said support structure is fabricated from electrically insulative material.

9. Apparatus as set forth in claim 6 wherein said components include disk drives.

10. Apparatus as set forth in claim 6 wherein said electrically insulative material is polycarbonate/ABS plastic.

11. Apparatus as set forth in claim 6 wherein said case further comprises a plurality of mounting means to which said support structure may be anchored.

12. Apparatus as set forth in claim 6 wherein said support structure spans substantially the entire inner surface of said front member and interior of said case.

13. Apparatus as set forth in claim 6 wherein said support structure includes a plurality of bays for housing a plurality of disk drives.

14. Apparatus as set forth in claim 13 wherein said support structure further comprises:

(a) a first side wall;

(b) a second side wall, substantially parallel to said first side wall; and (c) a front wall integrally molded to and extending between said first and second side walls, wherein said front wall includes a plurality of openings aligned with said bays to provide paths through which disk drives may be installed.

15. Apparatus set forth in claim 14 wherein said bays are formed between substantially parallel shelves extending between said first and second side walls.

16. Apparatus as set forth in claim 14 wherein the periphery of said front wall includes a plurality of bolt holes to facilitate bolting said support structure to the interior of said case.

17. Apparatus as set forth in claim 16 wherein said case includes bolt receiving holes that may be aligned with corresponding bolt holes in the front wall of said support structure when said support structure is situated within said open chamber.

18. Apparatus as set forth in claim 6 wherein said support structure further comprises a plurality of mounting pads, each including a bolt receiving hole, for securing said support structure to said side member of said case.

* * * * *